US012482640B2

(12) United States Patent
Aoki et al.

(10) Patent No.: US 12,482,640 B2
(45) Date of Patent: Nov. 25, 2025

(54) CLEANING METHOD, SUBSTRATE PROCESSING METHOD AND PLASMA PROCESSING APPARATUS

(71) Applicant: Tokyo Electron Limited, Tokyo (JP)

(72) Inventors: Yusuke Aoki, Miyagi (JP); Shun Itoh, Miyagi (JP); Yoshiki Fuse, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 287 days.

(21) Appl. No.: 17/978,601

(22) Filed: Nov. 1, 2022

(65) Prior Publication Data

US 2023/0138006 A1 May 4, 2023

(30) Foreign Application Priority Data

Nov. 1, 2021 (JP) ................................ 2021-178533

(51) Int. Cl.
*H01J 37/32* (2006.01)

(52) U.S. Cl.
CPC .. *H01J 37/32862* (2013.01); *H01J 37/32715* (2013.01); *H01J 2237/2007* (2013.01); *H01J 2237/20235* (2013.01); *H01J 2237/24564* (2013.01); *H01J 2237/334* (2013.01)

(58) Field of Classification Search
CPC .......... H01J 37/32862; H01J 37/32715; H01J 2237/2007; H01J 2237/20235; H01J 2237/24564; H01J 2237/334; H01J 37/32091; H01J 37/32697; H01L 21/6831
See application file for complete search history.

(56) References Cited

U.S. PATENT DOCUMENTS

| | | | | |
|---|---|---|---|---|
| 5,997,962 A * | 12/1999 | Ogasawara | H01J 37/32091 427/535 |
| 11,456,199 B2 * | 9/2022 | Kashimura | B23Q 17/002 |
| 2012/0006351 A1 * | 1/2012 | Jun | H01J 37/32862 134/1.1 |
| 2012/0241412 A1 * | 9/2012 | Murakami | H01J 37/32495 156/345.24 |
| 2015/0303092 A1 * | 10/2015 | Kawabata | G01R 19/25 361/234 |
| 2022/0139752 A1 * | 5/2022 | Aoki | H01J 37/32449 361/234 |
| 2023/0173557 A1 * | 6/2023 | Nakajima | H01J 37/32715 438/584 |

FOREIGN PATENT DOCUMENTS

JP 2014-056928 A 3/2014

* cited by examiner

*Primary Examiner* — Anita K Alanko
(74) *Attorney, Agent, or Firm* — PROCOPIO, CORY, HARGREAVES & SAVITCH LLP

(57) ABSTRACT

Provided is a cleaning method in a plasma processing apparatus for substrates. This cleaning method comprises: (a) forming a plasma in a chamber of the plasma processing apparatus while a substrate is not being held in place by an electrostatic chuck in the chamber; and (b) supplying voltage to the electrostatic chuck to reduce the charge on the surface of the electrostatic chuck while plasma is being formed in (a).

13 Claims, 18 Drawing Sheets

CLEANING METHOD, SUBSTRATE PROCESSING METHOD AND PLASMA PROCESSING APPARATUS

CROSS-REFERENCE TO RELATED APPLICATIONS

The present application claims priority under 35 U.S.C. § 119 to Japanese Patent Application No. 2021-178533 filed on Nov. 1, 2021, the entire contents of which are incorporated herein by reference.

BACKGROUND

1. Field

Exemplary embodiments of the present disclosure relate to a cleaning method, a substrate processing method, and a plasma processing apparatus.

2. Related Art

JP 2014-056928 A discloses a technique for suppressing adsorption due to residual charge in the surface layer of an electrostatic chuck.

SUMMARY

A cleaning method is provided in an exemplary embodiment of the present disclosure, in which the cleaning method comprises (a) forming a plasma in a chamber of the plasma processing apparatus while a substrate is not being held in place by an electrostatic chuck in the chamber; and (b) supplying voltage to the electrostatic chuck to reduce the charge on the surface of the electrostatic chuck while plasma is being formed in (a).

DETAILED DESCRIPTION

Figure 1:
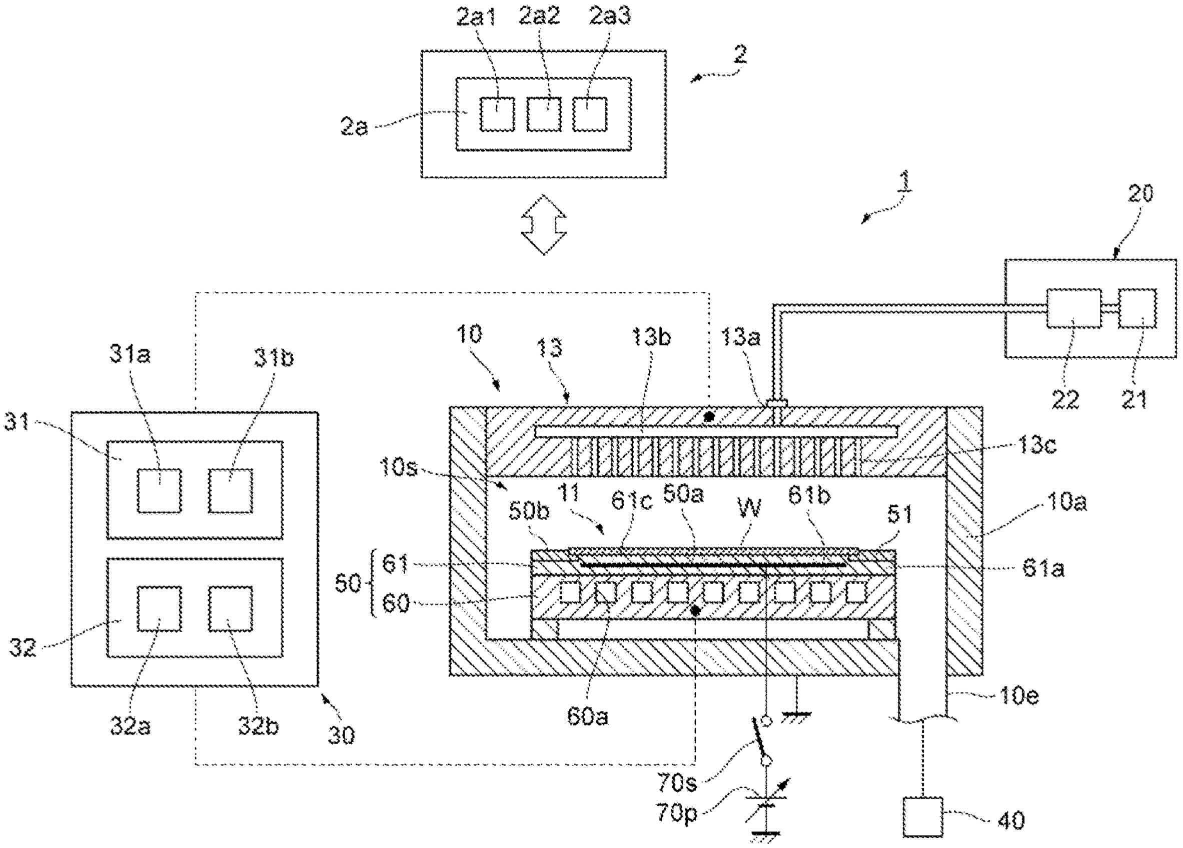
FIG. 1 is a figure schematically illustrating a substrate processing apparatus.

Embodiments of the present disclosure will now be described.

A cleaning method is provided in an exemplary embodiment. This cleaning method comprises: (a) forming a plasma in a chamber of the plasma processing apparatus while a substrate is not being held in place by an electrostatic chuck in the chamber; and (b) supplying voltage to the electrostatic chuck to reduce the charge on the surface of the electrostatic chuck while plasma is being formed in (a).

In an exemplary embodiment, (a) includes the supplying power for forming plasma, the supply of voltage to the electrostatic chuck in (b) begins after the supply of power for forming plasma has begun in (a), and the supply of voltage to the electrostatic chuck in (b) stops before the supply of power for forming plasma has stopped in (a).

In an exemplary embodiment, (a) includes the supplying gas for forming plasma, the supply of voltage to the electrostatic chuck in (b) begins after the supply of gas for forming plasma has begun in (a), and the supply of voltage to the electrostatic chuck in (b) stops before the supply of gas for forming plasma has stopped in (a).

An exemplary embodiment further comprises: (c) measuring the charged state on the surface of the electrostatic chuck while plasma is being formed in (a), wherein the voltage to be supplied to the electrostatic chuck in (b) is determined on the basis of the charged state on the surface of the electrostatic chuck measured in (c).

In an exemplary embodiment, the voltage to be supplied to the electrostatic chuck in (b) is determined from the measurement results for the charged state on the surface of the electrostatic chuck in (c) on the basis of the relationship between the charged state on the surface of the electrostatic chuck and the voltage to be supplied to the electrostatic chuck in the charged state on the surface of the electrostatic chuck.

In an exemplary embodiment, plasma is formed in the chamber in (a) to clean the surface of the electrostatic chuck in the chamber.

In an exemplary embodiment, plasma is formed in the chamber in (a) to clean the interior of the chamber.

In an exemplary embodiment, the cleaning method comprises: (a1) forming a plasma in a chamber of the plasma processing apparatus while a substrate is not being held in place by an electrostatic chuck in the chamber to clean the interior of the chamber; (b1) supplying voltage to the electrostatic chuck to reduce the charge on the surface of the electrostatic chuck while plasma is being formed in (a1); (a2) forming a plasma in a chamber of the plasma processing apparatus while a substrate is not being held in place by the electrostatic chuck in the chamber to clean the surface of the electrostatic chuck in the chamber; and (b2) supplying voltage to the electrostatic chuck to reduce the charge on the surface of the electrostatic chuck while plasma is being formed in (a2). In an exemplary embodiment, the voltage supplied to the electrostatic chuck in (b1) and in (b2) is different.

A substrate processing method is provided in an exemplary embodiment, the substrate processing method comprises: (a) and (b) in the cleaning method and (c) holding a substrate in place with the electrostatic chuck and subjecting the substrate to plasma treatment at least one of before and after (a) and (b).

A substrate processing method is provided in an exemplary embodiment. This substrate processing method comprises: (a) forming a plasma in a chamber of the plasma processing apparatus while a substrate is not being held in place by an electrostatic chuck in the chamber; (b) supplying voltage to the electrostatic chuck while plasma is being formed in (a); and (c) holding a substrate in place with the electrostatic chuck in the chamber of the plasma processing apparatus and subjecting the substrate to plasma treatment, wherein (c) is performed at least one of before and after (a) and (b), and the polarity of the voltage supplied to the electrostatic chuck in (b) is the same as the polarity of the voltage supplied to the electrostatic chuck in (c).

A plasma processing apparatus is provided in an exemplary embodiment. This plasma processing apparatus comprises: a chamber; an electrostatic chuck for holding a substrate in place in the chamber; a first power source for supplying power for plasma formation to the chamber; a second power supply for supplying voltage to the electrostatic chuck; and a controller, wherein the controller is configured to cause: (a) supplying power for plasma formation to the chamber from the first power source while a substrate is not being held in place by an electrostatic chuck in the chamber to form plasma in the chamber; and (b) supplying voltage to the electrostatic chuck from the second power supply while plasma is being formed in (a) to reduce the charge on the surface of the electrostatic chuck.

The following is a detailed description of embodiments of the present disclosure with reference to the drawings. In the drawings, identical or similar elements are denoted by the same reference numbers and redundant descriptions of these elements has been omitted. In the following description, positional relationships such as up, down, left and right are based on the positional relationships shown in the drawings except where otherwise specified. The dimensional ratios in the drawings do not indicate actual ratios, and the actual ratios are not limited to the ratios shown in the drawings.

<Configuration of Plasma Processing Apparatus 1>

An example of a configuration for the plasma processing system will now be described. FIG. 1 is a figure used to describe an example of a configuration for a capacitively coupled plasma processing apparatus. The substrate processing method in this exemplary embodiment ("the processing method" below) is executed by this plasma processing apparatus 1.

The plasma processing system includes a capacitively coupled plasma processing apparatus 1 and a controller 2. The capacitively coupled plasma processing apparatus 1 includes a plasma processing chamber 10 ("the chamber" below), a gas supply 20, a power supply 30, and an exhaust system 40. The plasma processing apparatus 1 also includes a substrate support 11 and a gas introducer. The gas introducer is configured to introduce at least one processing gas to the plasma processing chamber 10. The gas introducer includes a shower head 13. The substrate support 11 is arranged inside the plasma processing chamber 10. The shower head 13 is arranged above the substrate support 11. In an exemplary embodiment, the shower head 13 constitutes at least a portion of the ceiling of the plasma processing chamber 10. The plasma processing chamber 10 has a plasma processing space 10*s* defined by the shower head 13, the side walls 10*a* of the plasma processing chamber 10, and the substrate support 11. The plasma processing chamber 10 has at least one gas supply port for supplying at least one processing gas to the plasma processing space 10*s*, and at least one gas exhaust port for exhausting gas from the plasma processing space. The plasma processing chamber 10 is grounded. The shower head 13 and the substrate support 11 are electrically isolated from the plasma processing chamber 10.

The substrate support 11 includes a main body 50 and a ring assembly 51. The main body 50 has a central region 50*a* for supporting a substrate W and an annular region 50*b* for supporting the ring assembly 51. A wafer is an example of a substrate W. The annular region 50*b* of the main body 50 surrounds the central region 50*a* of the main body 50 in a plan view. The substrate W is arranged in the central region 50*a* of the main body 50, and the ring assembly 51 is arranged in the annular region 50*b* of the main body 50 so as to surround the substrate W in the central region 50*a* of the main body 50. Therefore, the central region 50*a* is also known as the substrate support surface for supporting the substrate W, and the annular region 50*b* is known as the ring support surface for supporting the ring assembly 51.

In one embodiment, the main body 50 includes a base 60 and an electrostatic chuck 61. The base 60 includes a conductive member. The conductive member of the base 60 can function as a lower electrode. The electrostatic chuck 61 is arranged on the base 60. The electrostatic chuck 61 includes a ceramic member 61*a* and an electrostatic electrode 61*b* disposed within the ceramic member 61*a*. The ceramic member 61*a* has a central region 50*a*. In one embodiment, the ceramic member 61*a* also has an annular region 50*b*. Note that another member surrounding the electrostatic chuck 61, such as an annular electrostatic chuck or an annular insulating member, may have the annular region 50*b*. In this case, the ring assembly 51 may be disposed on the annular electrostatic chuck or the annular insulating member, or may be disposed on both the electrostatic chuck 61 and the annular insulating member. An RF or DC electrode may also be placed within the ceramic member 61*a*, in which case the RF or DC electrode functions as the lower electrode. An RF or DC electrode is also referred to as a bias electrode if bias RF signals or DC signals described below are connected to the RF or DC electrode. Note that both the conductive member of the base 60 and the RF or DC electrode may function as two lower electrodes.

The electrostatic electrode 61*b* of the electrostatic chuck 61 is connected via a switch 70*s* to a DC power supply 70*p* serving as a second power supply. When DC voltage is supplied to the electrostatic electrode 61*b* from the DC power supply 70*p*, electrostatic attraction (Coulomb force)

is generated between the electrostatic chuck 61 and the substrate W. The substrate W is attracted to the electrostatic chuck 61 by the electrostatic attractive force and is held in place on the surface 61*c* of the electrostatic chuck 61. The surface 61*c* of the electrostatic chuck 61 may be flat or uneven. The electrostatic chuck 61 is not limited to a Coulomb type chuck using the Coulomb force, and may be of the Johnsen-Rahbek type chuck using the Johnsen-Rahbek effect.

The ring assembly 51 includes one or more annular members. In one embodiment, the one or more annular members include one or more edge rings and at least one cover ring. The edge ring or rings is made of a conductive material or an insulating material, and the cover ring is made of an insulating material.

Also, the substrate support 11 may include a temperature control module configured to keep at least one of the electrostatic chuck 61, the ring assembly 51, and the substrate at a target temperature. The temperature control module may include a heater, a heat transfer medium, a channel 60*a*, or combinations of these. A heat transfer fluid such as brine or a gas flows through the flow path 60*a*. In one embodiment, channels 60*a* are formed in the base 60 and one or more heaters are disposed in the ceramic member 61*a* of electrostatic chuck 61. The substrate support 11 may also include a heat transfer gas supply configured to supply a heat transfer gas between the back surface of the substrate W and the central region 50*a*.

Figure 2:
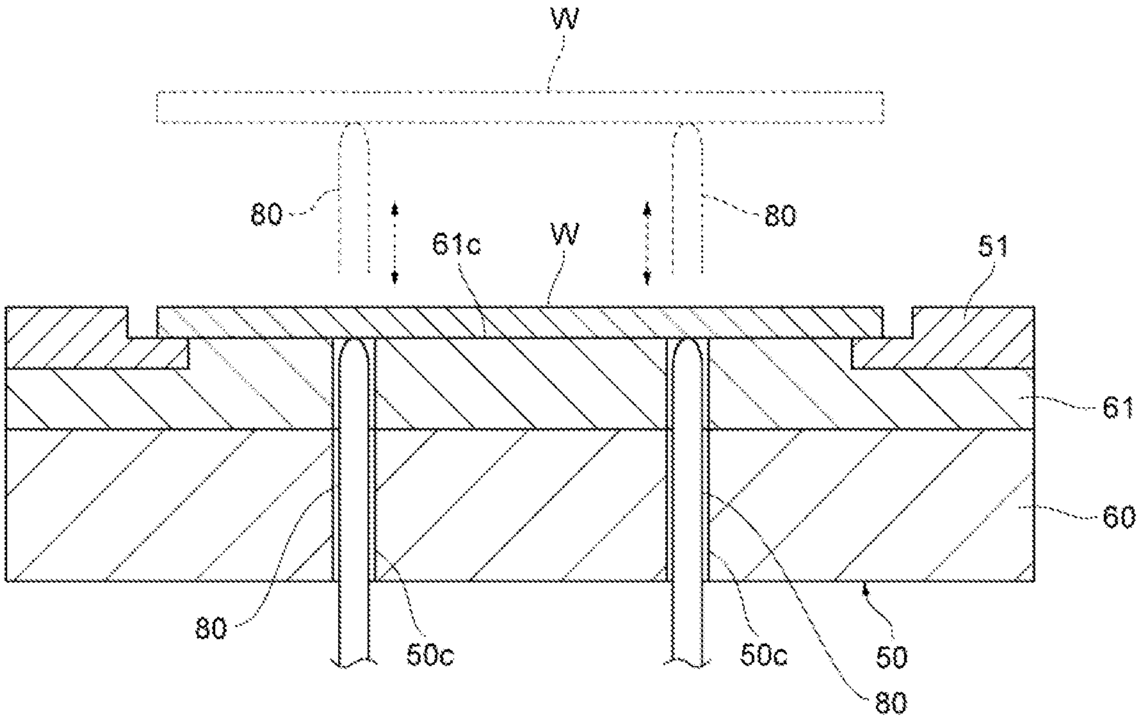
FIG. 2 is a figure showing an example of a main body with a lift pin.

As shown in FIG. 2, the main body 50 is formed with through holes 50*c* passing through in the vertical direction. In the main body 50, a lift pin 80 that can move through a through hole 50*c* in the vertical direction is provided in each through hole 50*c*. The lift pins 80 support the substrate W. Lift pins 80 are one example of a lifter that is used to support a substrate. The lift pins 80 are driven by a drive device (not shown). The lift pins 80 can lift the substrate W onto the electrostatic chuck 61 or above the electrostatic chuck 61. The substrate W can be placed on the surface 61*c* of the electrostatic chuck 61 by lowering the lift pins 80, and the substrate W can be removed from the surface 61*c* of the electrostatic chuck 61 by raising the lift pins 80.

The shower head 13 shown in FIG. 1 is configured to introduce at least one processing gas from the gas supply 20 to the plasma processing space 10*s*. The shower head 13 has at least one gas supply port 13*a*, at least one gas diffusion chamber 13*b*, and multiple gas introduction ports 13*c*. The processing gas supplied to the gas supply port 13*a* passes through the gas diffusion chamber 13*b* and is introduced to the plasma processing space 10*s* via the gas introduction ports 13*c*. The shower head 13 also includes an upper electrode. In addition to the showerhead 13, the gas introducer may include one or more side gas injectors (SGI) attached to one or more openings formed in a side wall 10*a*.

The gas supply 20 may include at least one gas source 21 and at least one flow controller 22. In one embodiment, the gas supply 20 is configured to supply at least one processing gas from its respective gas source 21 via its respective flow controller 22 to the shower head 13. Each flow controller 22 may include, for example, a mass flow controller or a pressure-controlled flow controller. The gas supply 20 may also include one or more flow modulating devices that modulate or pulse the flow rate of at least one processing gas.

The power supply 30 includes an RF power supply 31 serving as the first power supply coupled to the plasma processing chamber 10 via at least one impedance matching circuit. The RF power supply 31 is configured to supply at least one RF signal (RF power), such as a source RF signal and a bias RF signal, to at least one lower electrode and/or to at least one upper electrode. In this way, a plasma is formed from at least one processing gas supplied to the plasma processing space 10*s*. Thus, the RF power supply 31 may function as at least part of a plasma generator configured to form a plasma from one or more processing gases in the plasma processing chamber 10. Also, by supplying a bias RF signal to at least one lower electrode, a bias potential is generated in the substrate W, and ion components in the formed plasma can be attracted to the substrate W.

In one embodiment, the RF power supply 31 includes a first RF generator 31*a* and a second RF generator 31*b*. The first RF generator 31*a* is coupled to at least one lower electrode and/or to at least one upper electrode via at least one impedance matching circuit and configured to generate a source RF signal (source RF power) for plasma generation. In one embodiment, the source RF signal has a frequency in the range from 10 MHz to 150 MHz. In one embodiment, the first RF generator 31*a* may be configured to generate multiple source RF signals with different frequencies. One or more source RF signals generated are provided to at least one lower electrode and/or to at least one upper electrode.

A second RF generator 31*b* is coupled to the at least one lower electrode via at least one impedance matching circuit and configured to generate a bias RF signal (bias RF power). The frequency of the bias RF signal may be the same as or different from the frequency of the source RF signal. In one embodiment, the bias RF signal has a frequency lower than that of the source RF signal. In one embodiment, the bias RF signal has a frequency in the range from 100 kHz to 60 MHz. In one embodiment, the second RF generator 31*b* may be configured to generate multiple bias RF signals with different frequencies. One or more bias RF signals that have been generated are supplied to at least one lower electrode. Also, in various embodiments, at least one of the source RF signal and the bias RF signal may be pulsed.

The power supply 30 may also include a DC power supply 32 coupled to the plasma processing chamber 10. The DC power supply 32 includes a first DC generator 32*a* and a second DC generator 32*b*. In one embodiment, the first DC generator 32*a* is connected to at least one lower electrode and configured to generate a first DC signal. A generated first bias DC signal is supplied to at least one lower electrode. In one embodiment, the second DC generator 32*b* is connected to at least one upper electrode and configured to generate a second DC signal. The generated second DC signal is supplied to at least one upper electrode.

In various embodiments, at least one of the first and second DC signals may be pulsed. In this case, a sequence of DC-based voltage pulses is supplied to at least one lower electrode and/or at least one upper electrode. The voltage pulses may have rectangular, trapezoidal or triangular pulse waveforms, or some combination of these pulse waveforms. In one embodiment, a waveform generator for generating a sequence of voltage pulses from a DC signal is connected between the first DC generator 32*a* and at least one lower electrode. Thus, the first DC generator 32*a* and the waveform generator constitute a voltage pulse generator. When a second DC generator 32*b* and a waveform generator constitute a voltage pulse generator, the voltage pulse generator is connected to at least one upper electrode. The voltage pulse may have a positive polarity or a negative polarity. Also, the sequence of voltage pulses may include one or more positive voltage pulses and one or more negative voltage pulses in a single cycle. Note that first and second DC generators 32*a*, 32*b* may be provided in addition to the RF power supply 31, or a first DC generator 32*a* may be provided instead of a second RF generator 31*b*.

The exhaust system 40 can be connected, for example, to a gas outlet 10*e* provided at the bottom of the plasma processing chamber 10. The exhaust system 40 may include a pressure regulating valve and a vacuum pump. The pressure regulating valve regulates the pressure inside the plasma processing space 10*s*. The vacuum pump may include a turbo molecular pump, a dry pump, or a combination of these.

The controller 2 processes computer-executable instructions that get the plasma processing apparatus 1 to perform the steps described in the present disclosure. The controller 2 may be configured to get each element in the plasma processing apparatus 1 to perform the steps described in the present specification. In an exemplary embodiment, some or all of the controller 2 may be provided as part of the plasma processing apparatus 1. The controller 2 may include, for example, a computer 2*a*. The computer 2*a* may include, for example, a central processing unit (CPU) 2*a*1, a storage unit 2*a*2, and a communication interface 2*a*3. The central processing unit 2*a*1 may be configured to perform control operations by retrieving a program from the storage unit 2*a*2 and executing the retrieved program. This program may be stored in the storage unit 2*a*2 in advance or may be acquired via another medium when necessary. The acquired program is stored in the storage unit 2*a*2, retrieved from the storage unit 2*a*2 and executed by the central processing unit 2*a*1. The medium may be any storage medium readable by the computer 2*a* or may be a communication line connected to the communication interface 2*a*3. The storage unit 2*a*2 may include random access memory (RAM), read-only memory (ROM), a hard disk drive (HDD), a solid state drive (SSD), or a combination of these. The communication interface 2*a*3 may communicate with other configurations in the plasma processing apparatus 1 via a communication line such as a local area network (LAN).

<Configuration of Substrate Processing System PS>

Figure 3:
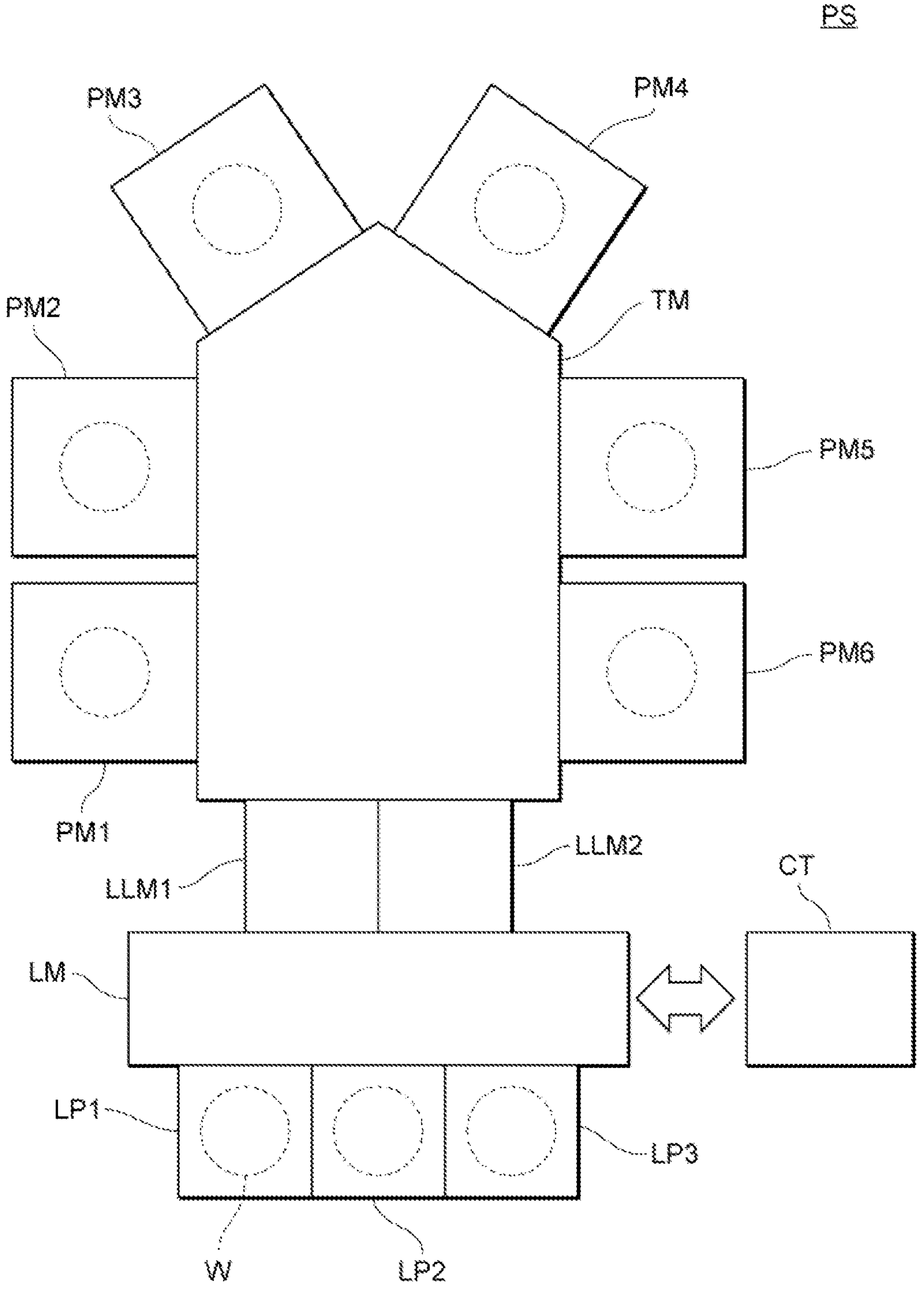
FIG. 3 is a figure schematically illustrating an example of the substrate processing system.

FIG. 3 is a figure schematically illustrating a substrate processing system PS in an exemplary embodiment of the present disclosure. The substrate processing system PS in this exemplary embodiment includes the plasma processing apparatus 1.

The substrate processing system PS includes substrate processing modules PM1 to PM6 (referred to collectively as "the substrate processing modules PM" below), a transfer module TM, load lock modules LLM1 and LLM2 (referred to collectively as "the load lock modules LLM" below), a loader module LM, and load ports LP1 to LP3 (referred to collectively as "the load ports LP" below). The controller CT controls each configuration in the substrate processing system PS and executes given processing on the substrate W.

The substrate processing modules PM internally perform processing such as etching processing, trimming processing, film formation processing, annealing processing, doping processing, lithography processing, cleaning processing, and ashing processing on the substrate W. A portion of the substrate processing modules PM may be a measuring module for measuring the film thickness of the film formed on the substrate W, the dimensions of the pattern formed on the substrate W, etc. The plasma processing apparatus 1 shown in FIG. 1 is one example of a substrate processing module PM.

The transfer module TM has a transfer device for transferring substrates W, and transfers substrate W between substrate processing modules PM or between a substrate processing module PM and a load lock module LLM. The substrate processing modules PM and the load lock modules LLM are arranged adjacent to the transfer module TM. The transfer module TM, the substrate processing modules PM, and the load lock modules LLM are spatially isolated from or connected to each other via a gate valve that can be opened and closed.

The load lock modules LLM1 and LLM2 are provided between the transfer module TM and the loader module LM. The pressure inside the load lock module LLM can be switched to atmospheric pressure or to a vacuum. A load lock module LLM transfers a substrate W from an atmospheric pressure loader module LM to a vacuum transfer module TM, and also from a vacuum transfer module TM to an atmospheric pressure loader module LM.

The loader module LM has a transfer device for transferring substrates W, and transfers substrates W between a load lock module LLM and a load port LP. A FOUP (front opening unified pod), for example, that can accommodate 25 substrates W or an empty FOUP can be placed inside the load port LP. The loader module LM removes substrates W from the FOUP inside the load port LP and transfers them to a load lock module LLM. The loader module LM also removes substrates W from the load lock module LLM and transfers them to the FOUP inside the load port LP.

The controller CT controls each configuration in the substrate processing system PS and executes given processing on substrates W. The controller CT stores recipes for processing procedures, processing conditions, and transfer conditions, etc. and controls each configuration in the board processing system PS to execute predetermined processing on substrates W based on the recipes. The controller CT may also include some or all of the functions of the controller 2 for the plasma processing apparatus 1 shown in FIG. 1.

<Example of the Processing Method>

Figure 4:
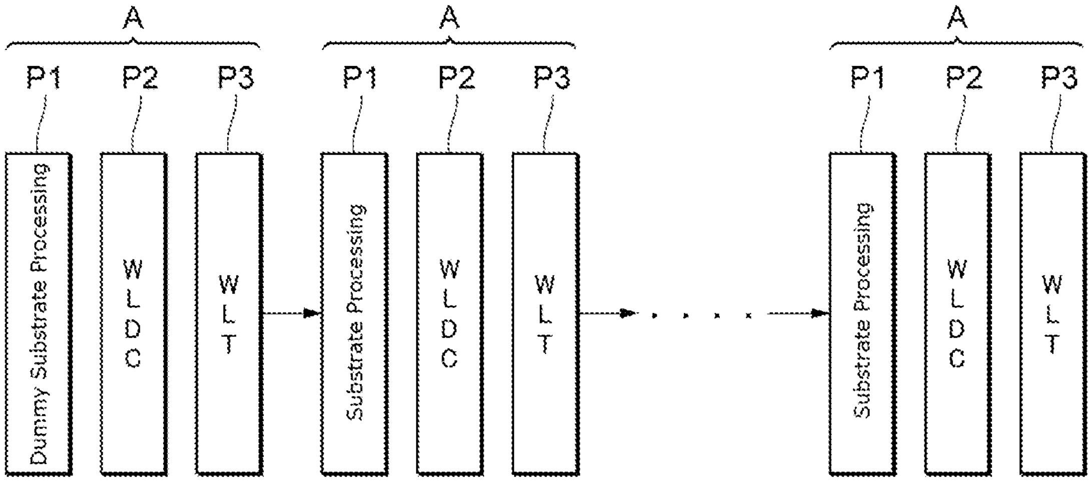
FIG. 4 is a figure used to explain an example of a sequence for the substrate processing method.

FIG. 4 is a figure used to explain an example of a sequence of this processing method performed by the plasma processing apparatus 1. In this processing method, the plasma processing apparatus 1 performs processing A, which includes plasma processing P1 of the substrate W, a first cleaning process P2, and a second cleaning process P3, in this order. The first cleaning process P2 is also referred to as waferless dry cleaning (WLDC), and the second cleaning process P3 is also referred to as waferless treatment (WLT). When the plasma processing apparatus 1 is processing multiple substrates W in a single lot, processing A is performed several times. The substrates W to be processed in the first plasma processing P1 performed on a single lot may be dummy substrates instead of product substrates. In one example, the dummy substrates may be substrates without patterned resist film.

<Plasma Processing P1 of Substrate W>

Plasma processing P1 includes, for example, etching a film on a substrate W using a plasma.

First, the substrate W is carried into the plasma processing chamber 10 by a transfer arm (not shown) and transferred to the lift pins 80 as indicated by dotted lines in FIG. 2. Next, the substrate W is lowered by the lift pins 80 onto the surface 61*c* of the electrostatic chuck 61. Next, DC voltage is supplied to the electrostatic electrode 61*b* of the electrostatic chuck 61 by the DC power supply 70*p* shown in FIG. 1. The electrostatic attraction generated between the electrostatic chuck 61 and the substrate W attracts and holds the substrate W in place on the surface 61*c* of the electrostatic chuck 61.

Next, a processing gas is supplied from the shower head 13 to the plasma processing space 10*s*. The processing gas supplied at this time contains a gas that generates active species necessary to the substrate W etching process. The RF power supply 31 supplies high RF power to the lower electrode. The atmosphere in the plasma processing space 10*s* may be exhausted from the gas outlet 10*e*, and the pressure in the plasma processing space 10*s* reduced to a predetermined pressure. In this way, a plasma is generated in the plasma processing space 10*s* and the substrate W is etched.

The etching process is performed for a predetermined amount of time, after which the supply of processing gas to the plasma processing space 10*s* and the supply of high RF power to the lower electrode are stopped to end the etching process.

Afterward, the supply of DC voltage to the electrostatic electrode 61*b* is stopped. The substrate W is then lifted by the lift pins 80 away from the surface 61*c* of the electrostatic chuck 61. The substrate W is removed from the plasma processing chamber 10 by a transport arm (not shown).

<First Cleaning Process P2>

The first cleaning process P2 includes removing by-products attached or deposited on the interior of the plasma processing chamber 10, such as the side walls 10*a* or the ceiling wall using plasma without a substrate W on the surface 61*c* of the electrostatic chuck 61. In the first cleaning process P2, by-products attached or deposited on the electrostatic chuck 61 may be removed.

First, after a substrate W has been removed from the plasma processing chamber 10 in the plasma processing P1 described above, a processing gas is supplied from the shower head 13 to the plasma processing space 10*s* while a substrate W is not being held in place on the surface 61*c* of the electrostatic chuck 61. The processing gas contains a gas that generates active species capable of removing by-products generated in the plasma processing P1. For example, if the by-product is a CF-based polymer, the processing gas may be $O_2$ gas. The processing gas is not limited to $O_2$ gas, and may be some other oxygen-containing gas such as CO gas, $CO_2$ gas, or $O_3$ gas). When the by-products contain silicon or another metal in addition to a CF-based polymer, the processing gas may contain, for example, a halogen-containing gas in addition to an oxygen-containing gas. A halogen-containing gas is, for example, a fluorine-based gas such as $CF_4$ gas or $NF_3$ gas. The halogen-containing gas may also be a chlorine-based gas such as $Cl_2$ gas or a bromine-based gas such as HBr gas.

Next, the RF power supply 31 supplies high RF power to the lower electrode. The atmosphere in the plasma processing space 10*s* may be exhausted from the gas exhaust port 10*e*, and the pressure in the plasma processing space 10*s* reduced to a predetermined pressure. As a result, a plasma is formed in the plasma processing space 10*s*, and by-products inside the plasma processing chamber 10 are removed. The frequency of the high RF power generated by the RF power supply 31 may be, for example, 10 MHz or more and 100 MHz or less, or may be 40 MHz or more and 100 MHz or less. The high RF power may also be, for example, 50 W or more and 10,000 W or less, 100 W or more and 7,000 W or less, or 200 W or more and 2,000 W or less.

After the plasma has been formed for a predetermined amount of time, the supply of high RF power and the supply of processing gas are stopped to end the first cleaning process P2.

<Second Cleaning Process P3>

Figure 5:
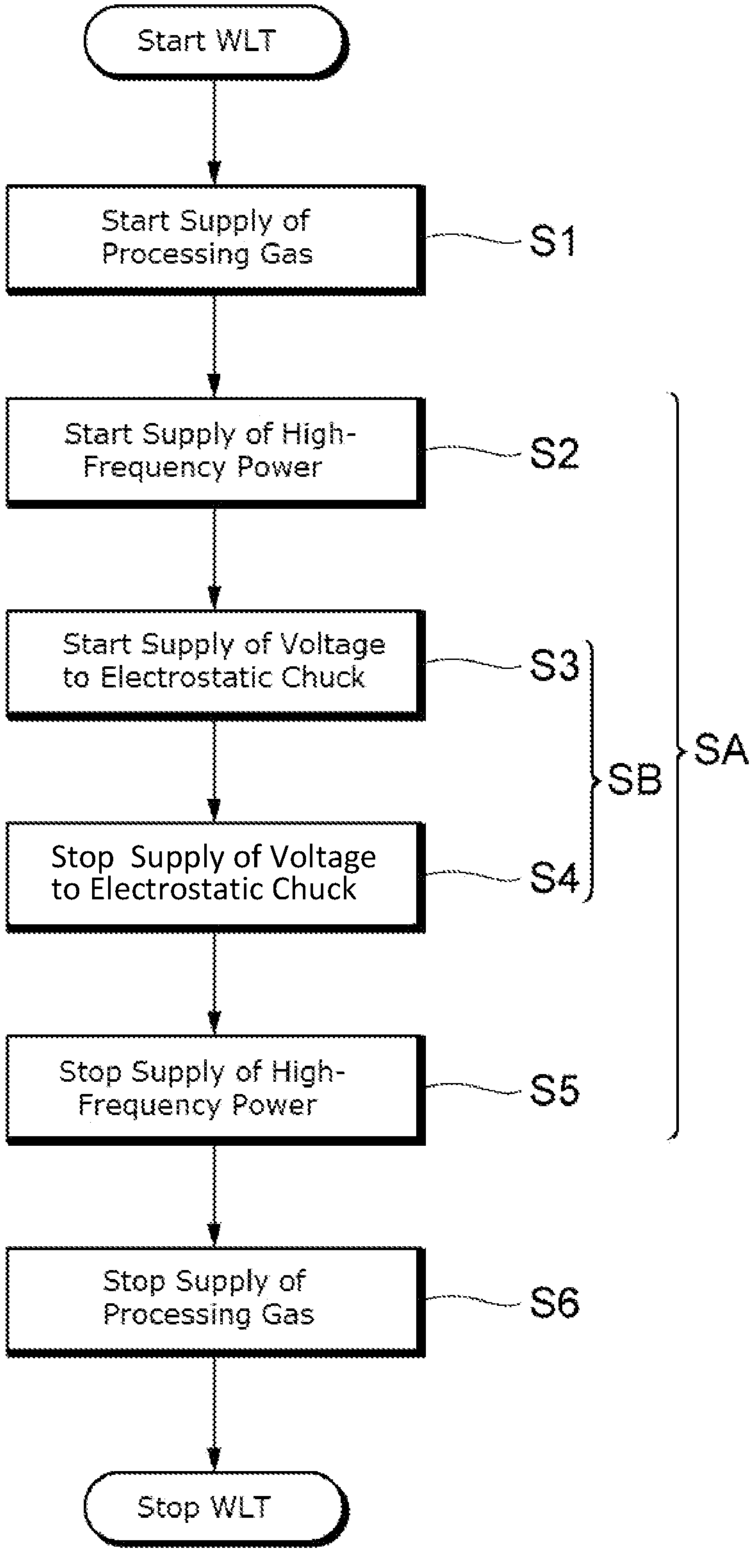
FIG. 5 is a flowchart showing an example of the second cleaning process.
Figure 6:
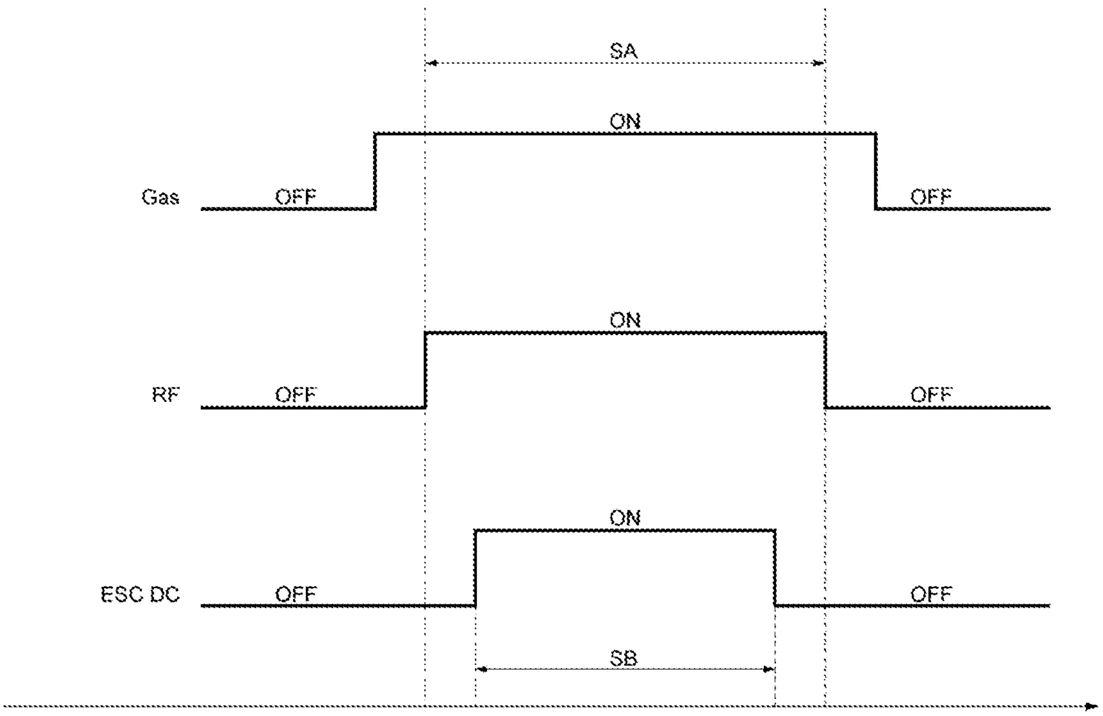
FIG. 6 is a figure used to explain an example of the sequence for supplying processing gas, supplying RF power, and supplying voltage to the electrostatic chuck in the second cleaning process.

The second cleaning process P3 includes modifying the surface 61*c* of the electrostatic chuck 61 in the plasma processing chamber 10 using a plasma while a substrate W is not on the surface 61*c* of the electrostatic chuck 61. A cleaning method according to the present embodiment (also referred to as "the cleaning method") is included in the second cleaning process P3. FIG. 5 is a flowchart showing an example of the second cleaning process P3, and FIG. 6 is a sequence chart showing the timing for supplying processing gas (gas) for plasma formation, supplying the high RF power (RF) for plasma formation, and supplying voltage (ESCDC) to the electrostatic chuck 61.

When the second cleaning process P3 has started, first, the supply of processing gas from the shower head 13 to the plasma processing space 10*s* is started while a substrate W is not being held in place on the surface 61*c* of the electrostatic chuck 61 (Step S1 in FIG. 5). The processing gas supplied at this time includes one that formes a plasma necessary for modifying the surface 61*c* of an electrostatic chuck 61 that has been exposed to plasma in the plasma processing P1 and in the first cleaning processing P2. The processing gas may be an inert gas such as N2 gas. Next, the RF power supply 31 starts supplying high RF power to the lower electrode (forming plasma) (step S2 in FIG. 5). Thus, a plasma is formed from, for example, N2 gas in the plasma processing space 10*s*, the surface 61*c* of the electrostatic chuck 61 is nitrided, and fluorine on the surface 61*c* is removed. The high RF power supplied in the second cleaning process P3 may be higher than the high RF power supplied in the first cleaning process P2. The timing for starting the supply of processing gas (step S1) and the timing for starting the supply of high RF power (step S2) may be the same.

Figure 7:
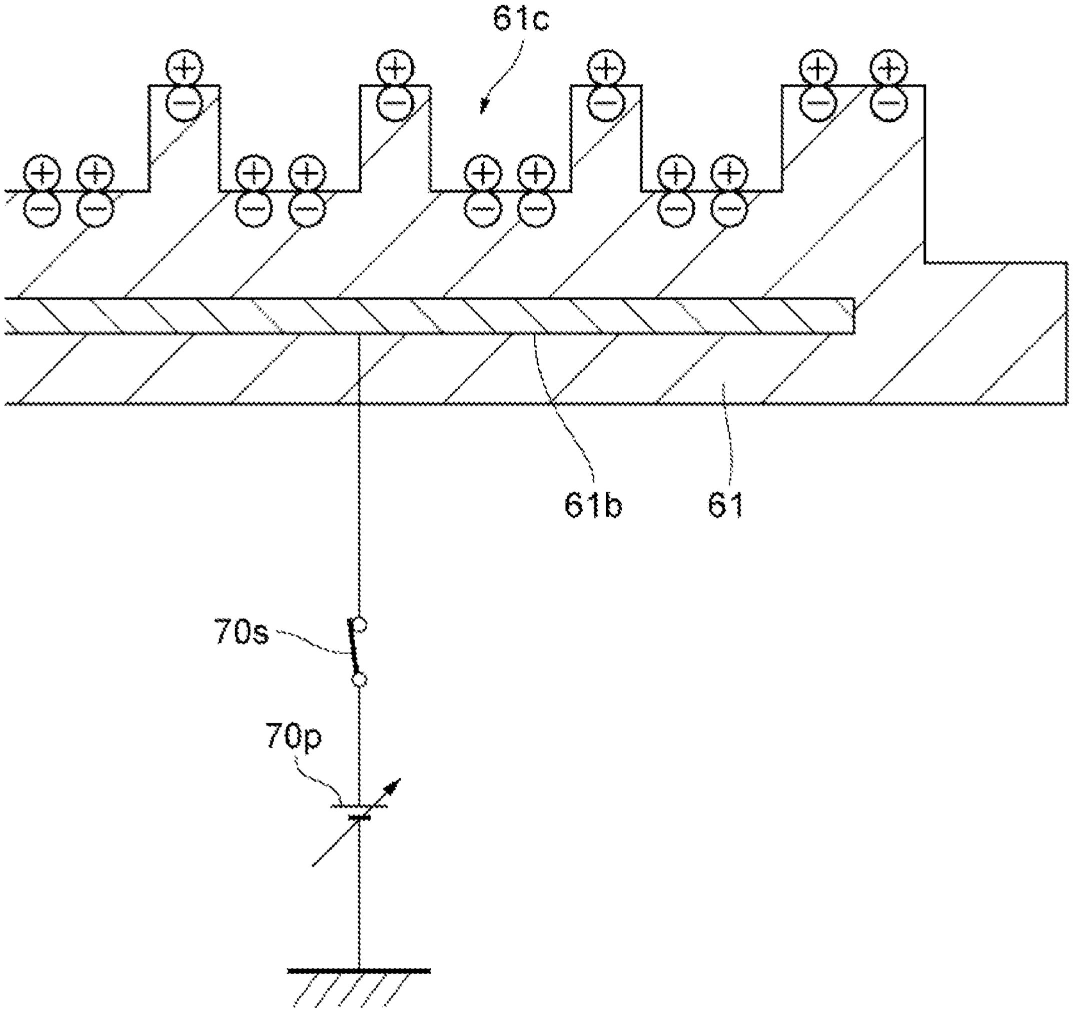
FIG. 7 is a figure used to explain an example of a charged state on the surface of the electrostatic chuck.

DC voltage is supplied to the electrostatic electrode 61*b* of the electrostatic chuck 61 while a plasma is being formed in the plasma processing space 10*s* (plasma forming step SA in FIG. 5) to lower the charge on the surface 61*c* of the electrostatic chuck 61 (step S3 in FIG. 5). For example, when a positive charge has been formed on the surface 61*c* of the electrostatic chuck 61 by plasma formation as shown in FIG. 7, positive DC voltage, for example, is supplied to the electrostatic electrode 61*b* of the electrostatic chuck 61 from the DC power supply 70*p*. As a result, the surface 61*c* of the electrostatic chuck 61 is negatively charged, the charges cancel each other out, and the charge on the surface 61*c* is reduced. Conversely, when a negative charge has been generated on the surface 61*c* of the electrostatic chuck 61, negative DC voltage is supplied to the electrostatic electrode 61*b* of the electrostatic chuck 61, for example. As a result, the surface 61*c* of the electrostatic chuck 61 is positively charged, the charges cancel each other out, and the charge on the surface 61*c* is reduced. Note that in the example shown in FIG. 7, the surface 61*c* of the electrostatic chuck 61 has an uneven shape. In one exemplary embodiment, the polarity of the voltage supplied to the electrostatic chuck 61 during the cleaning process P3 is the same polarity as that of the voltage supplied to the electrostatic chuck 61 during the plasma process P1 for a substrate W.

Afterward, for a predetermined amount of time, the processing gas is supplied, the high RF power is supplied, a plasma is formed, and the DC voltage is supplied to the electrostatic chuck 61 (voltage supplying step SB in FIG. 5).

Afterward, the supply of voltage to the electrostatic chuck 61 is stopped (step S4 in FIG. 5). Next, the supply of high RF power is stopped (step S5 in FIG. 5) and then the supply of processing gas is stopped (step S6 in FIG. 5). With this, the second cleaning process P3 ends. Note that in this exemplary embodiment, the plasma forming process SA includes steps (steps S2 to S5) in which both the processing gas and high RF power are supplied, and a voltage supplying step SB between steps S4 and S5.

In this exemplary embodiment, the cleaning method has a step SA of forming plasma in the chamber 10 while a substrate W is not being held in place by the electrostatic chuck 61 in the chamber 10 of the plasma processing apparatus 1 and a step SB of supplying voltage to the electrostatic chuck 61 to reduce the charge on the surface 61*c* of the electrostatic chuck 61 while the plasma is being formed during the plasma forming step SA. This makes it possible to reduce the charge remaining on the surface 61*c* of the electrostatic chuck 61 during the second cleaning process P3. As a result, the number of particles adhering to the back surface of substrates W can be reduced in the plasma processing P1 following the second cleaning process P3. In addition, the torque of the lift pins 80 can be reduced when a substrate W is detached from the electrostatic chuck 61. This point will now be described in greater detail with reference to FIG. 8 and FIG. 9.

Figure 8A:
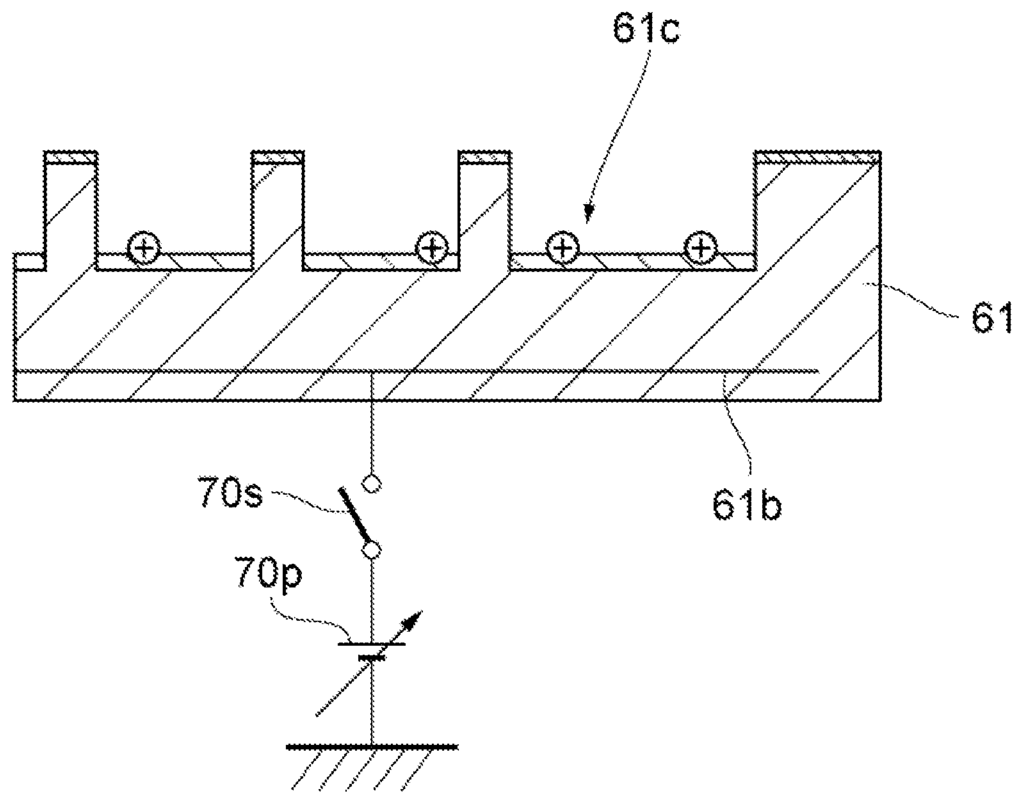
FIG. 8A is a diagram schematically illustrating an example of the charged state on the surface of the electrostatic chuck after the cleaning process when the cleaning process of the present invention is not used.

When this cleaning method is not used, that is, when no voltage is supplied to the electrostatic chuck 61 during the cleaning process P3, a positive charge remains on the surface 61*c* of the electrostatic chuck 61 after the cleaning process P3 as shown in FIG. 8A.

Figure 8B:
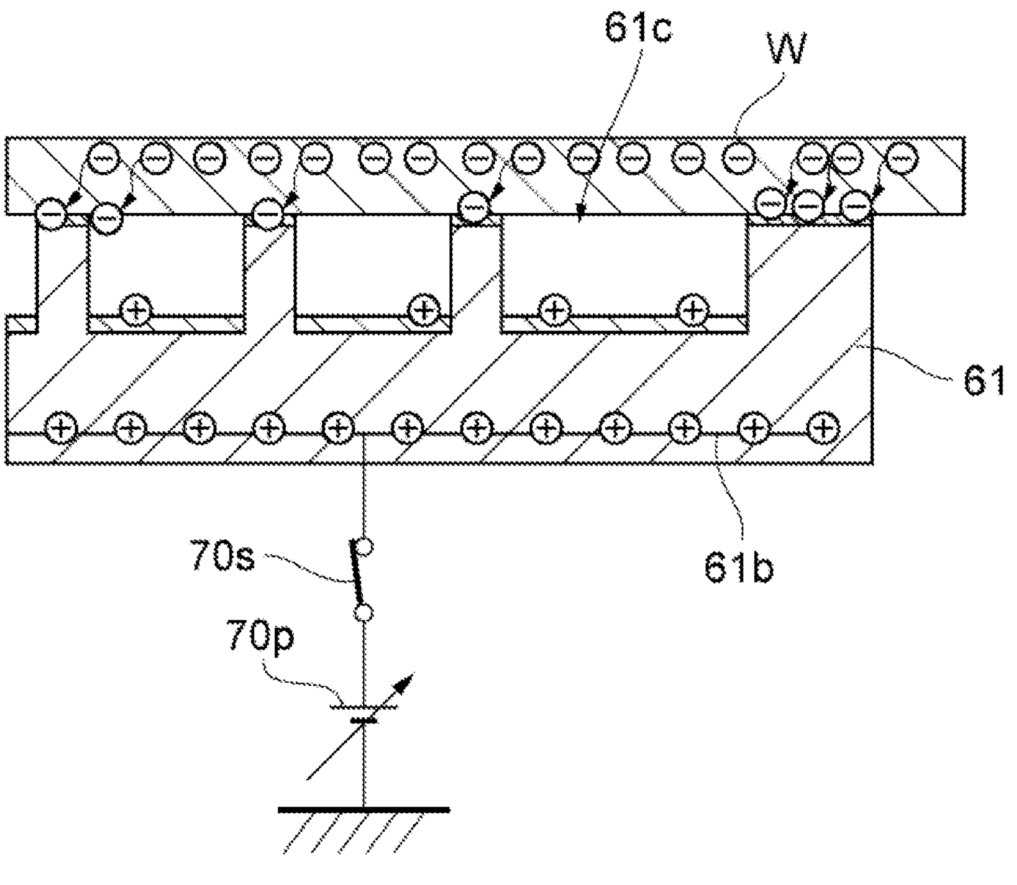
FIG. 8B is a diagram schematically illustrating an example of the charged state on the surface of the electrostatic chuck during subsequent plasma processing when the cleaning process of the present invention is not used.

As a result, when the substrate W is attracted to the electrostatic chuck 61 during subsequent plasma processing P1, an excessively negative charge is transferred from the substrate W to the electrostatic chuck 61, and the attraction force of the electrostatic chuck 61 increases as shown in FIG. 8B. In this state, the difference in coefficients of thermal expansion between the substrate W and the electrostatic chuck 61 cause the number of particles generated by friction between the back surface of the substrate W and the surface of the electrostatic chuck 61 to increase.

Figure 8C:
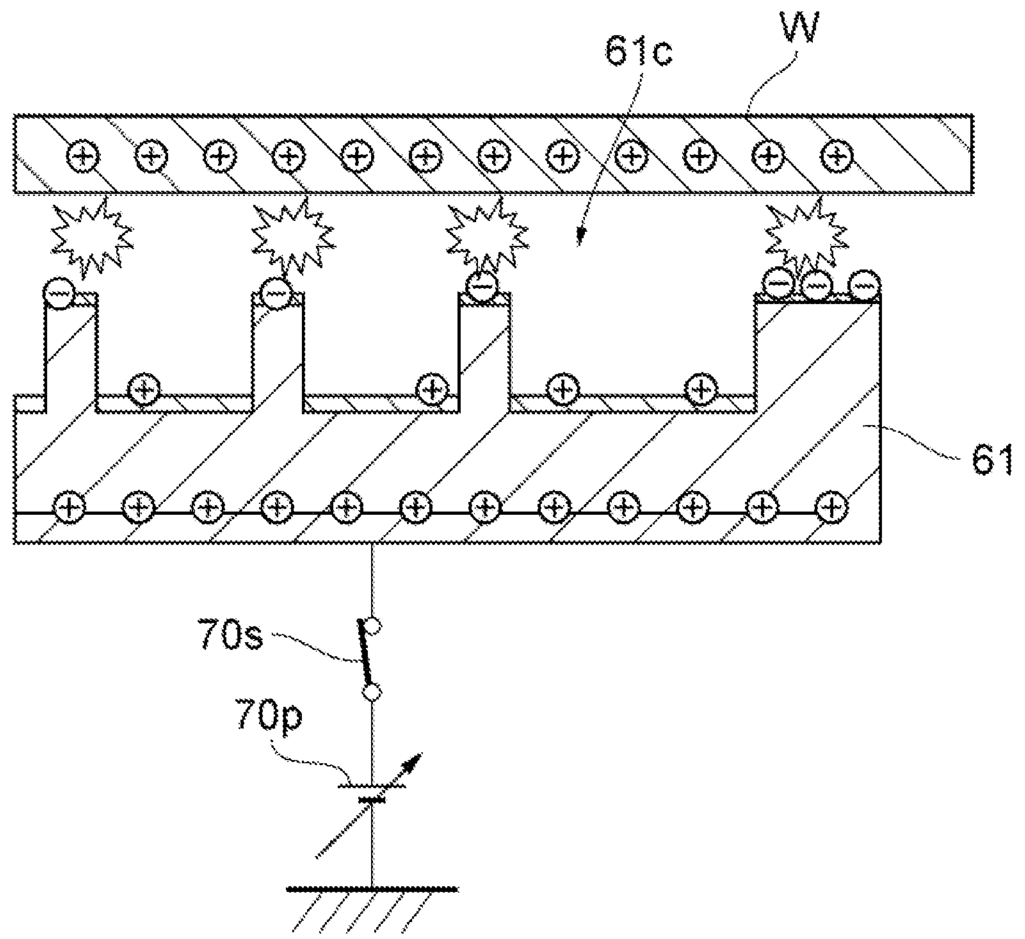
FIG. 8C is a diagram schematically illustrating an example of the charged state on the surface of the electrostatic chuck after the subsequent plasma processing when the cleaning process of the present invention is not used.

In addition, the residual charge increases after plasma processing P1, as shown in FIG. 8C, and the pin torque of the lift pins increases when the substrate W is detached from the electrostatic chuck 61.

Figure 9A:
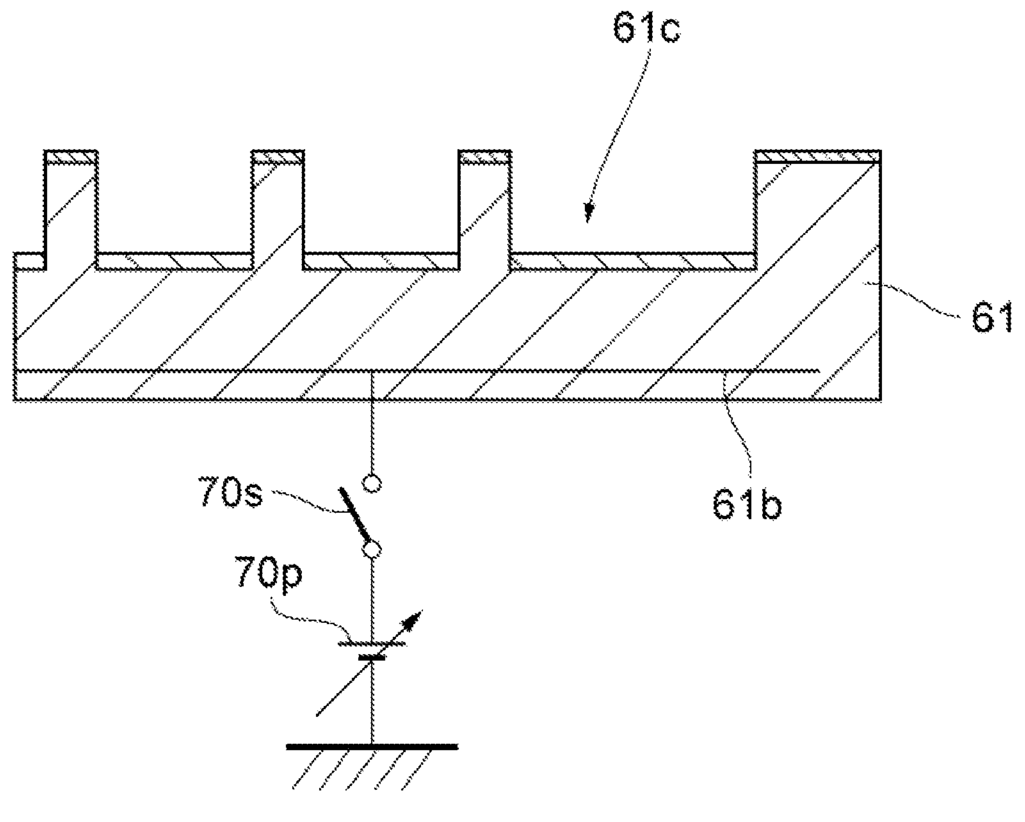
FIG. 9A is a diagram schematically illustrating an example of the charged state on the surface of the electrostatic chuck after the cleaning process when the cleaning process of the present invention is used.

When the cleaning method is used, that is, when voltage is supplied to the electrostatic chuck 61 during the cleaning process P3, a positive charge remaining on the surface 61*c* of the electrostatic chuck 61 after the cleaning process P3 can be reduced as shown in FIG. 9A.

Figure 9B:
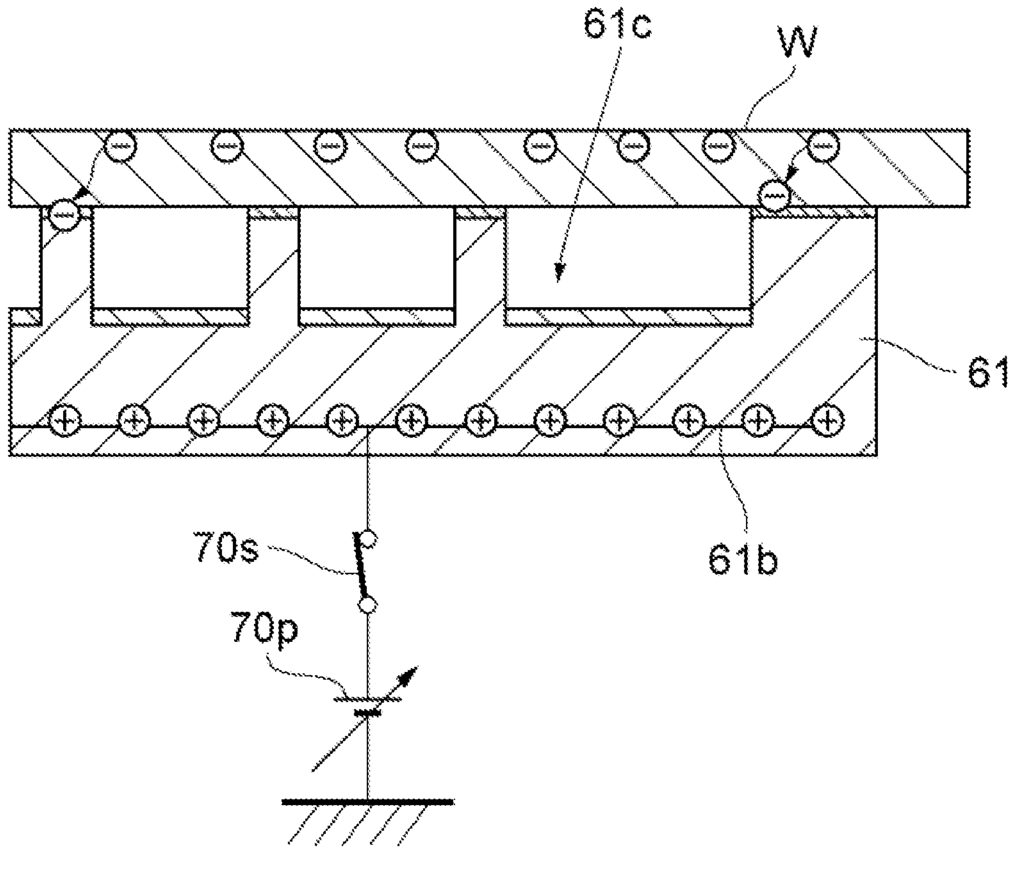
FIG. 9B is a diagram schematically illustrating an example of the charged state on the surface of the electrostatic chuck during subsequent plasma processing when the cleaning process of the present invention is used.

Therefore, when the substrate W is attracted to the electrostatic chuck 61 during subsequent plasma processing P1, the movement of a negative charge from the substrate W to the electrostatic chuck 61 is suppressed as shown in FIG. 9B, and an increase in the adsorption force of the electrostatic chuck 61 is suppressed. As a result, the number of particles generated by friction between the back surface of the substrate W and the surface of the electrostatic chuck 61 can be reduced.

Figure 9C:
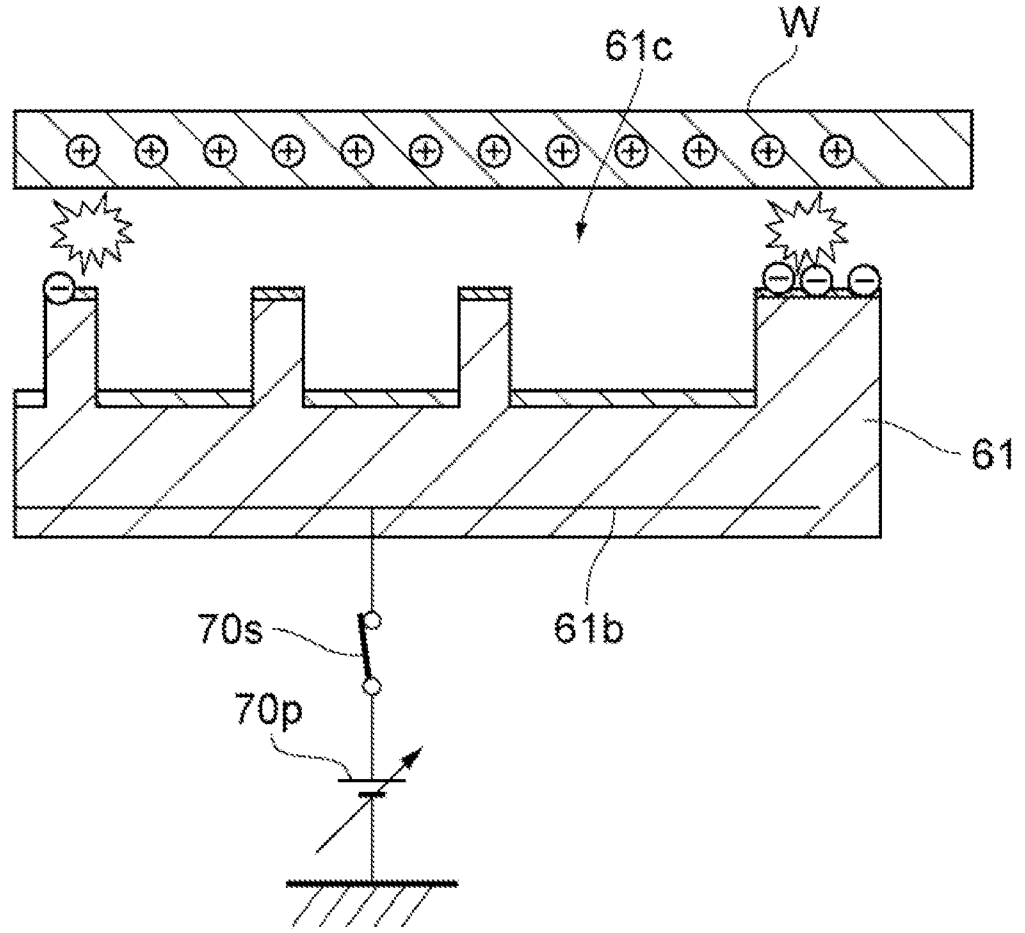
FIG. 9C is a diagram schematically illustrating an example of the charged state on the surface of the electrostatic chuck after the subsequent plasma processing when the cleaning process of the present invention is used.

Also, an increase in the residual charges after plasma processing P1 is suppressed, as shown in FIG. 9C, so an increase in pin torque can be suppressed when the substrate W is detached from the electrostatic chuck 61 by the lift pins.

In this exemplary embodiment, the supply of voltage to the electrostatic chuck 61 is started after the supply of high RF power for plasma formation has been started in the plasma formation step SA (after step S2), and the supply of voltage to the electrostatic chuck 61 is stopped before the supply of the high RF power for plasma formation in the plasma formation step SA has been stopped (before step S5). As a result, voltage is supplied to the electrostatic chuck 61 only while plasma is being formed. This makes it possible to prevent discharges that may occur due to the supply of voltage to the electrostatic chuck 61 while no plasma is being formed.

In this exemplary embodiment, the supply of voltage to the electrostatic chuck 61 is started after the supply of processing gas for plasma formation has been started in the plasma formation step SA (after step S1), and supply of voltage to the electrostatic chuck 61 is stopped before the supply of processing gas for plasma formation has been stopped in the plasma formation step SA (before step S6). As a result, voltage is supplied to the electrostatic chuck 61 only while plasma is being formed. This makes it possible to prevent discharges that may occur due to the supply of voltage to the electrostatic chuck 61 while no plasma is being formed.

In the plasma formation step SA of the cleaning method in this exemplary embodiment, plasma is formed in the chamber 10 to clean the surface 61*c* of the electrostatic chuck 61 in the chamber 10. In the second cleaning process P3, a large charge tends to remain on the surface 61*c* of the electrostatic chuck 61 in a plasma state. Therefore, by supplying voltage to the electrostatic chuck 61 in the second cleaning process P3, the residual charge can be effectively reduced.

In this exemplary embodiment, the processing method includes a step SA of forming plasma in the chamber 10 while a substrate W is not being held in place by the electrostatic chuck 61 in the chamber 10 of the plasma processing apparatus 1, a step of supplying voltage to the electrostatic chuck 61 to reduce the charge on the surface 61*c* of the electrostatic chuck 61 while the plasma is being formed during the plasma forming step SA, and a step of holding a substrate W in place on an electrostatic chuck 61 in the chamber 10 of the plasma processing apparatus 1 and subjecting the substrate W to plasma processing (plasma processing P1). As a result, the charge remaining on the surface 61*c* of the electrostatic chuck 61 can be reduced when the electrostatic chuck 61 is not holding a substrate W in place, for example, during the second cleaning process P3. The plasma processing P1 in which a substrate W is held in place on the electrostatic chuck 61 is then performed, for example, subsequent to the second cleaning processing P3. In this plasma processing P1, particles adhering to the back surface of the substrate W can be reduced. Also, the torque of the lift pins 80 can be reduced for when the substrate W is detached from the electrostatic chuck 61. In addition, even when a charge generated by the plasma processing P1 performed prior to the second cleaning processing P3 remains in the electrostatic chuck 61, the residual charge from the previous plasma process P1 and the residual charge generated during the second cleaning process P3 can be reduced together in the second cleaning process P3.

In this exemplary embodiment, the plasma processing apparatus 1 includes a chamber 10, an electrostatic chuck 61 that holds a substrate W in place in the chamber 10, an RF power supply 31 serving as the first power supply for supplying plasma forming power to the chamber 10, a DC power supply 70*p* serving as the second power supply for supplying voltage to the electrostatic chuck 61, and a controller 2. The controller 2 executes a step SA of forming plasma in the chamber 10 by supplying power for plasma formation to the chamber 10 from the RF power supply 31 while a substrate W is not being held in place by the electrostatic chuck 61 in the chamber 10, and a step of supplying voltage to the electrostatic chuck 61 from the DC power source 70*p* to reduce the charge on the surface 61*c* of the electrostatic chuck 61 while the plasma is being formed in the plasma forming step SA. This can reduce the charge remaining on the surface 61*c* of the electrostatic chuck 61 during substrate processing using the plasma processing apparatus 1, for example, during the second cleaning process P3 when a substrate W is not being held in place by the electrostatic chuck 61. Plasma processing P1 in which a substrate W is held in place on the electrostatic chuck 61 is then performed, for example, after the second cleaning processing P3. In this plasma processing P1, the number of particles adhering to the back surface of the substrate W can be reduced. Also, the torque of the lift pins 80 can be reduced for when the substrate W is detached from the electrostatic chuck 61.

Example

Figure 10:
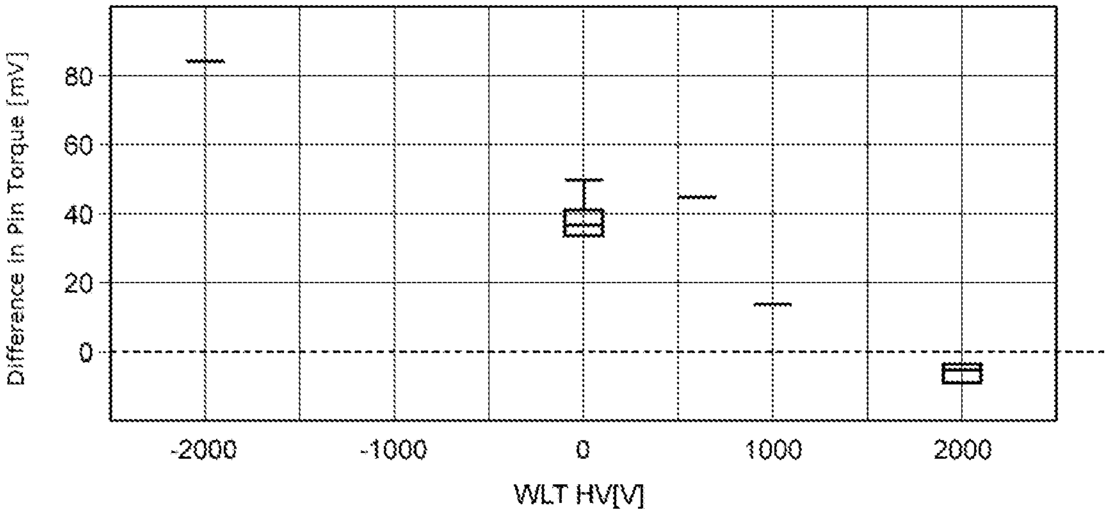
FIG. 10 is a graph showing the relationship between the lift pin torque difference and the supplied voltage.

In plasma processing P1 following a cleaning process in which this cleaning method was used, the torque of the lift pins required to detach a substrate W from the electrostatic chuck 61 was measured. The torque of the lift pins required to detach a substrate W from the electrostatic chuck 61 was also measured in plasma processing P1 performed after a conventional cleaning process in which this cleaning method was not used. The graph in FIG. 10 shows the difference between the lift pin torque in the plasma processing P1 after the cleaning process using the cleaning method and the lift pin torque during plasma processing P1 after a conventional cleaning process. The horizontal axis in the graph shown in FIG. 10 is the voltage supplied to the electrostatic chuck 61. It can be seen from these measurement results that the torque of the lift pins during plasma processing P1 is reduced by supplying voltage properly to the electrostatic chuck 61.

Figure 11:
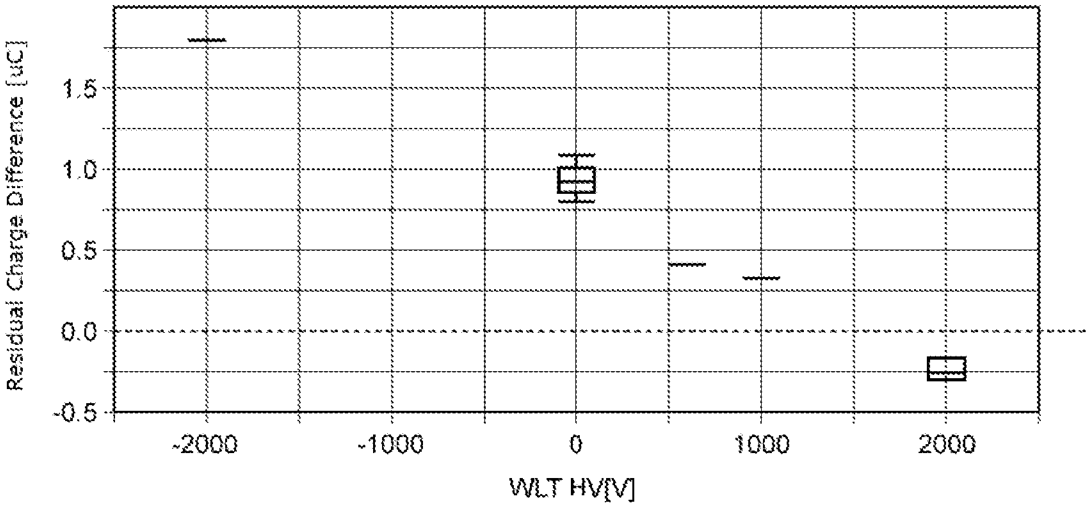
FIG. 11 is a graph showing the relationship between the residual charge difference and the supplied voltage.

The residual charge on the surface of the electrostatic chuck 61 was measured during plasma processing P1 performed after a cleaning process using the cleaning method. The residual charge on the surface of the electrostatic chuck 61 was also measured during plasma processing P1 performed after a cleaning process that did not use the cleaning method. The graph in FIG. 11 shows the difference between the residual charge in plasma processing P1 after a cleaning process using the cleaning method and the residual charge in the plasma processing P1 after a conventional cleaning process. The horizontal axis in the graph shown in FIG. 11 is the voltage supplied to the electrostatic chuck 61. It can be seen from these measurement results that the proper supply of voltage to the electrostatic chuck 61 reduces the residual charge during plasma processing P1.

Figure 12:
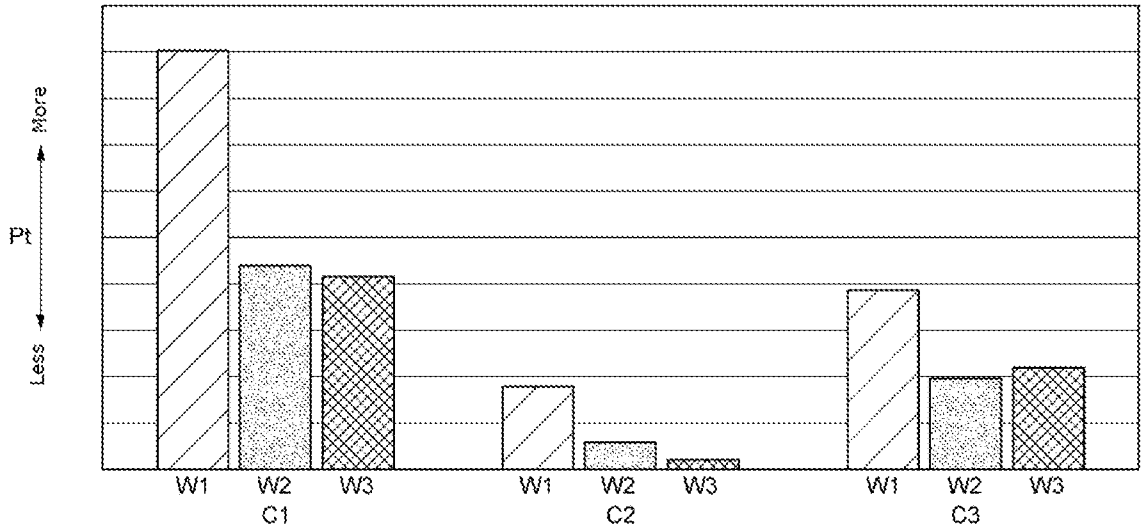
FIG. 12 is a graph showing the effect of the cleaning method of the present invention on reducing the number of particles.

The number of particles (case C1) on the back surface of substrates (three substrates W1, W2, W3) due to the plasma processing P1 performed alone, the number of particles (case C2) on the back surface of substrates (three substrates W1, W2, W3) due to the plasma processing P1 performed after the second cleaning process P3 using the cleaning method, and the number of particles (case C3) on the back surface of substrates (three substrates W1, W2, W3) due to the plasma processing P1 performed after the second cleaning process P3 which did not use the cleaning method were measured. The measurements were then compared. The results are shown in the graph in FIG. 12. Note that "Pt" in FIG. 12 refers to back surface particles. It can be seen from these measurement results that the number of particles on the back surface of substrates W is reduced in plasma processing P1 (case C2) performed after a second cleaning process P3 using the cleaning method.

<Another Exemplary Embodiment of the Cleaning Method>

The voltage supplied to the electrostatic chuck 61 in the cleaning method may be predetermined based on theoretical values or empirical principles. The voltage supplied to the electrostatic chuck 61 in the cleaning method may also be determined based on charged states of the surface 61*c* of the electrostatic chuck 61 that have been measured. For example, the cleaning method may have a step of measuring the charged state of the surface of the electrostatic chuck 61 while plasma is being formed in the plasma formation step SA, and the voltage supplied to the electrostatic chuck 61 may be determined based on the charged state of the surface 61*c* of the electrostatic chuck 61 measured in the charged state measurement step. In addition, the voltage supplied to the electrostatic chuck 61 may be determined from measurement results of the charged state of the surface 61*c* of the electrostatic chuck 61 on the basis of the relationship between the charged state on the surface 61*c* of the electrostatic chuck 61 and the voltage to be supplied to the electrostatic chuck 61 in that charged state. One exemplary embodiment will now be described.

<Configuration of Measuring Device 100>

Figure 13:
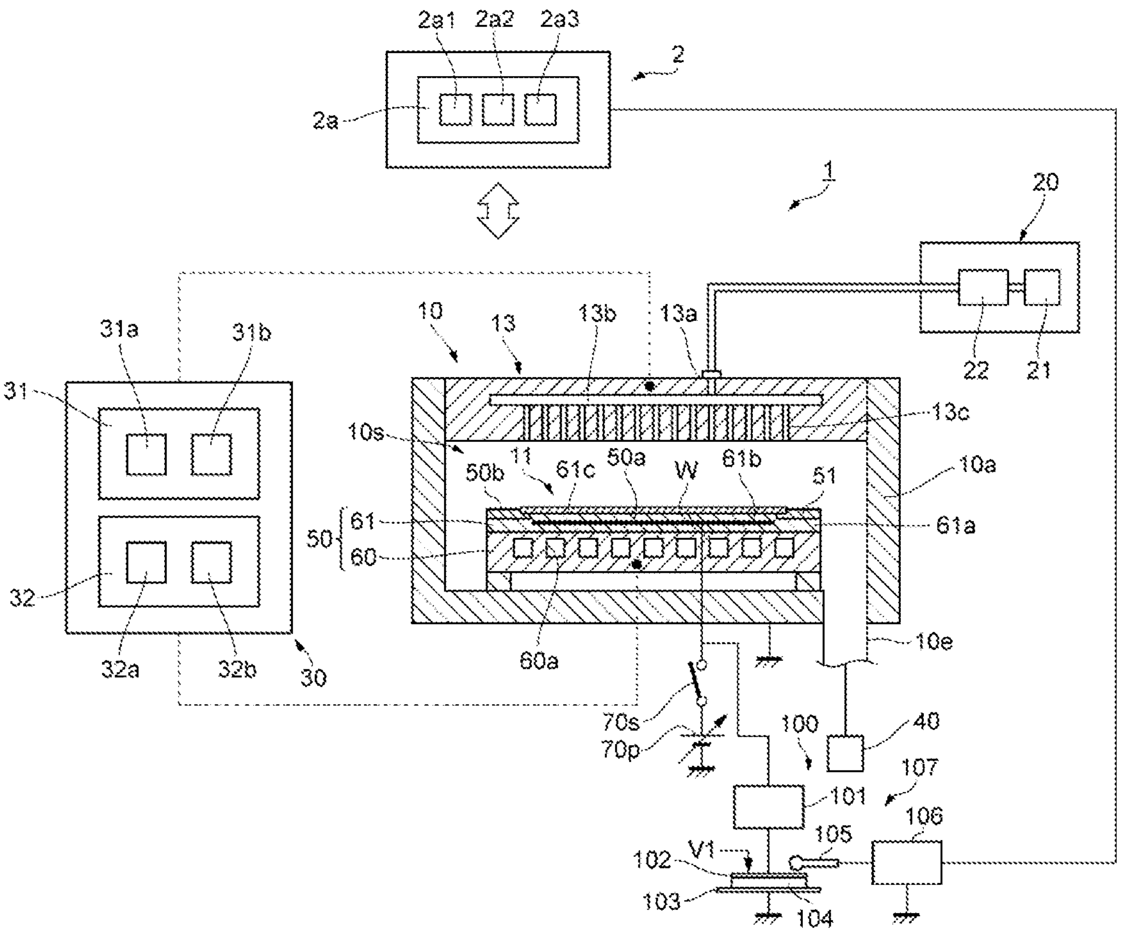
FIG. 13 schematically illustrates an example of a plasma processing apparatus having a measuring device.

In one exemplary embodiment, the charged state of the surface 61*c* of the electrostatic chuck 61 corresponds to the potential V1 of the electrostatic electrode 61*b* of the electrostatic chuck 61. For example, when the surface 61*c* of the electrostatic chuck 61 is positively charged, the potential V1 of the electrostatic electrode 61*b* decreases and becomes negative. Also, when the surface 61*c* of the electrostatic chuck 61 is negatively charged, the potential V1 of the electrostatic electrode 61*b* rises and becomes positive. Therefore, as shown in FIG. 13, the plasma processing apparatus 1 in one exemplary embodiment includes a measuring device 100 that measures the potential V1 of the electrostatic electrode 61*b* corresponding to the charged state of the surface 61*c* of the electrostatic chuck 61.

The measuring device 100 has, for example, a filter 101, a copper disk 102, a copper plate 103, an acrylic plate 104, a probe 105, and a surface potential meter 106. A probe 105 and the surface potential meter 106 constitute the potential measuring system 107.

In order to simplify the explanation, the switch 70*s* to the electrostatic chuck 61 is shown separately from the measuring device 100, but the measuring device 100 may include the switch 70*s*. The switch 70*s* is used to switch the connection of the electrostatic electrode 61*b* between the DC power source 70*p* and a member of the measuring device 100 having capacitance. The switch 70*s* connects the electrostatic electrode 61*b* to the measuring device 100 when the charged state of the surface 61*c* of the electrostatic chuck 61 is to be measured. An example of a member having capacitance is a member with a configuration in which the acrylic plate 104 is interposed between a copper disc 102 and a copper plate 103. The member having capacitance is not limited to a configuration with a copper disk 102, a copper plate 103 and an acrylic plate 104, and can be configured using an insulated conductor.

In the potential measuring system 107, the potential formed in the acrylic plate 104 between the copper disc 102 and the copper plate 103 is measured by the surface potential meter 106 using the probe 105 provided on the surface of the copper disc 102 without making contact. The potential measuring system 107 is just one example of a measuring unit that measures a value corresponding to the amount of charge accumulated in a member having capacitance. The probe 105 may make contact with the copper disc 102 or not as long as it can measure the potential difference between the copper disc 102 and the copper plate 103.

A filter 101 for removing high RF power is provided between the switch 70*s* and the member having capacitance. This keeps high RF power from propagating to the measurement device 100. When the switch 70*s* switches from the side connected to the DC power supply 70*p* to the side connected to the member having capacitance in the measuring device 100, the potential V1 generated in the member having capacitance can be measured. In other words, the potential V1 of the electrostatic electrode 61*b* in a floating state can be measured.

Specifically, the copper plate 103 is grounded, and the potential measured by the surface potential meter 106 using the probe 105 provided on the surface of the copper disc 102 in a non-contact state is the potential V1 of the electrostatic electrode 61*b* in a floating state.

Information on the potential V1 measured by the surface potential meter 106 is outputted to the controller 2 as information indicating the charged state of the electrostatic chuck 61, and the controller 2 controls the DC power supply 70*p* based on this information to supply to the electrostatic chuck 61 voltage that reduces the charge on the surface 61*c* of the electrostatic chuck 61.

Figure 14:
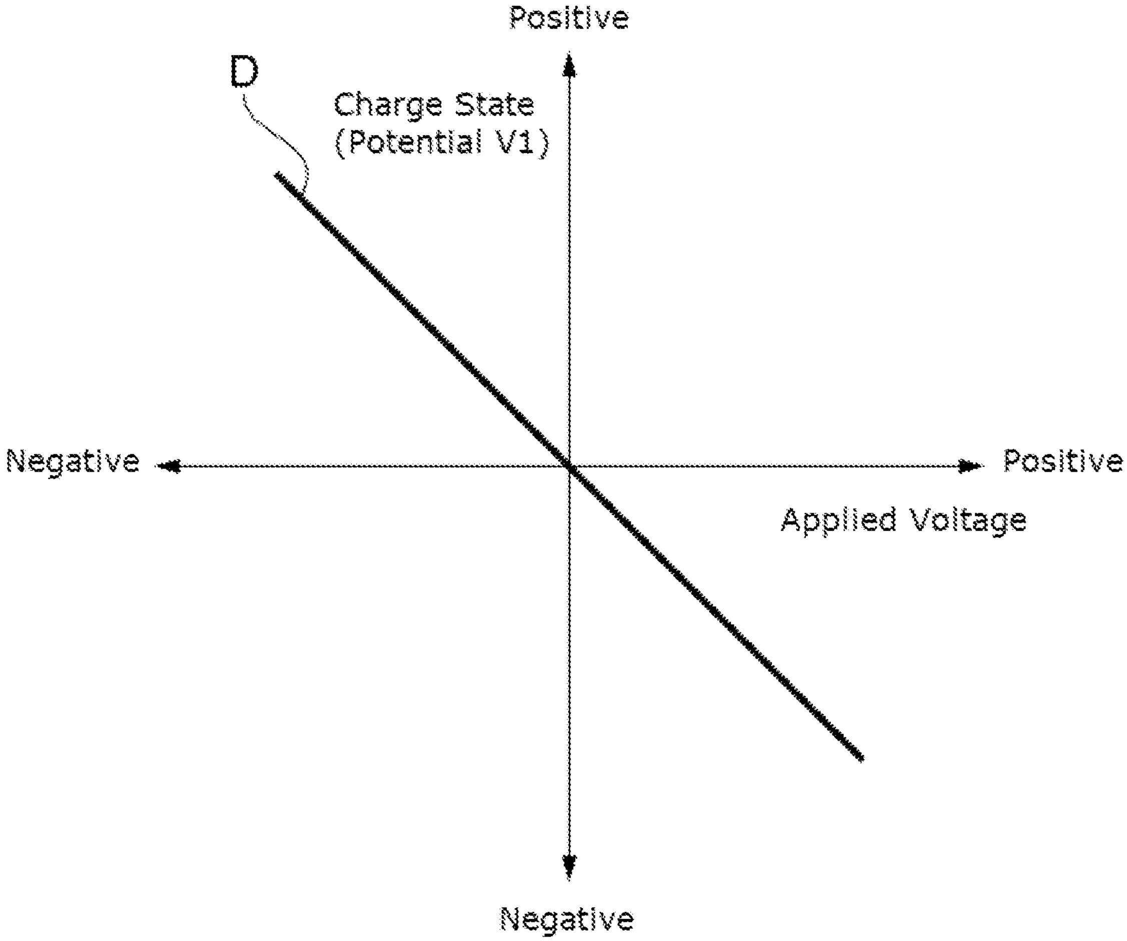
FIG. 14 is a figure showing an example of correlation data between the charged state (potential V1) and the supplied voltage.

The controller 2 has correlation data D indicating the relationship between the charged state (for example, the potential V1) shown in FIG. 14 and the voltage to be supplied to the electrostatic chuck 61 in that charged state. Correlation data D may be created, for example, from data obtained by operating the plasma processing apparatus 1 prior to processing a substrate W, or may be created from theoretical values or calculated values. From measurement results on the charged state of the surface 61*c* of the electrostatic chuck 61 obtained by the measuring device 100, the controller 2, on the basis of the correlation data D, determines the voltage to be supplied to the electrostatic chuck 61 in response to the charge generated by the plasma during the measured cleaning process.

<Second Cleaning Process P3 Using the Measuring Device 100>

In the second cleaning process P3, the measuring device 100 measures the potential V1 of the electrostatic electrode 61*b*. This potential V1 corresponds to the charged state of the surface 61*c* of the electrostatic chuck 61. During the second cleaning process P3, the measurement may be performed continuously, intermittently, or once at a specific time.

Specifically, the measuring device 100 measures the potential V1 of the electrostatic electrode 61*b* of the electrostatic chuck 61 using the probe 105 and the surface potential meter 106. The measured potential V1 is outputted to the controller 2, and the controller 2, on the basis of the correlation data D, determines the voltage (positive or negative voltage, value, etc.) to be supplied to the electrostatic chuck 61 in response to the potential V1 (charged state).

The controller 2 then controls the DC power supply 70*p* to supply to the electrostatic electrode 61*b* of the electrostatic chuck 61 voltage that reduces the charge on the surface 61*c* of the electrostatic chuck 61. For example, when the potential V1 of the electrostatic electrode 61*b* of the electrostatic chuck 61 changes in the positive direction, that is, when the surface 61*c* of the electrostatic chuck 61 is positively charged, positive voltage is supplied to the electrostatic electrode 61*b* of the electrostatic chuck 61 in order to supply the surface 61*c* of the electrostatic chuck 61 with a negative charge. A higher positive voltage is supplied to the electrostatic electrode 61*b* of the electrostatic chuck 61 as the positive potential change of the electrostatic electrode 61*b* increases.

Conversely, when the potential V1 of the electrostatic electrode 61*b* of the electrostatic chuck 61 changes in the negative direction, that is, when the surface 61*c* of the electrostatic chuck 61 is negatively charged, positive voltage is supplied to the electrostatic electrode 61*b* of the electrostatic chuck 61 in order to supply the surface 61*c* of the electrostatic chuck 61 with a positive charge. A lower negative voltage is supplied to the electrostatic electrode 61*b* of the electrostatic chuck 61 as the negative potential change of the electrostatic electrode 61*b* decreases.

In this exemplary embodiment, the charge on the surface 61*c* of the electrostatic chuck 61 can be reduced accurately and reliably.

Note that the measuring device for measuring the charged state of the surface 61*c* of the electrostatic chuck 61 is not limited to the configuration of the measuring device 100 described above. The potential V1 of the electrostatic electrode 61*b* does not have to be measured if the charged state of the surface 61*c* of the electrostatic chuck 61 is measured directly or a value corresponding to the charged state is measured.

<Application of the Cleaning Method to the First Cleaning Process P2>

This cleaning method may be applied to the first cleaning process P2.

Here, when the first cleaning process P2 has been started, the supply of processing gas from the shower head 13 to the plasma processing space 10*s* is first started while a substrate W is not being held on the surface 61*c* of the electrostatic chuck 61. The processing gas supplied at this time includes one that formes the plasma necessary for removing by-products formed during plasma processing P1. Next, the RF power supply 31 starts supplying high RF power to the lower electrode. As a result, plasma is formed in the plasma processing space 10*s*, and by-products inside the plasma processing chamber 10 are removed. Voltage is supplied to the electrostatic chuck 61 while the plasma is being formed, and the charge on the surface 61*c* of the electrostatic chuck 61 is reduced. For example, when a positive charge is generated on the surface 61*c* of the electrostatic chuck 61 due to plasma formation as shown in FIG. 7, positive DC voltage is supplied to the electrostatic electrode 61*b* of the electrostatic chuck 61. As a result, the surface 61*c* of the electrostatic chuck 61 is negatively charged, the charges cancel each other out, and the charge on the surface 61*c* is reduced. Conversely, for example, when a negative charge is generated on the surface 61*c* of the electrostatic chuck 61, negative DC voltage is supplied to the electrostatic electrode 61*b* of the electrostatic chuck 61. As a result, the surface 61*c* of the electrostatic chuck 61 is positively charged, the charges cancel each other out, and the charge on the surface 61*c* is reduced.

Afterward, for a predetermined time, the processing gas is supplied, the RF power is supplied, plasma is formed, and the DC voltage is supplied to the electrostatic chuck 61.

Afterward, the supply of voltage to the electrostatic chuck 61 is stopped. Next, the supply of high RF power is stopped, and then the supply of processing gas is stopped. With this, the first cleaning process P2 ends.

In this exemplary embodiment, the charge remaining on the surface 61*c* of the electrostatic chuck 61 can be reduced during the first cleaning process P2.

This cleaning method may be applied to the first cleaning process P2 alone and not to the second cleaning process P3, or may be applied to both the first cleaning process P2 and the second cleaning process P3. In other words, the cleaning method may comprise the steps of: (a1) forming a plasma in a chamber of the plasma processing apparatus while a substrate is not being held in place by an electrostatic chuck in the chamber to clean the interior of the chamber and (b1) supplying voltage to the electrostatic chuck to reduce the charge on the surface of the electrostatic chuck while plasma is being formed in step (a1) in the first cleaning method P2; and (a2) forming a plasma in a chamber of the plasma processing apparatus while a substrate is not being held in place by the electrostatic chuck in the chamber to clean the surface of the electrostatic chuck in the chamber and (b2) supplying voltage to the electrostatic chuck to reduce the charge on the surface of the electrostatic chuck while plasma is being formed in step (a2) in the second cleaning method P3. In this case, the charge remaining on the surface 61*c* of the electrostatic chuck 61 can be reduced during the first cleaning process P2 and during the second cleaning process P3.

When this cleaning method is applied to both the first cleaning process P2 and the second cleaning process P3, the voltage supplied to the electrostatic chuck 61 in the first cleaning process P2 and in the second cleaning process P3 may be different. Also, the voltage supplied to the electrostatic chuck 61 may be higher in the second cleaning process P3 than in the first cleaning process P2. In this case, the voltage supplied is increased in the second cleaning process P3, in which the charge on the electrostatic chuck 61 is relatively large, so that energy efficiency can be improved.

Various modifications may be made to the cleaning method and processing method without departing from the scope and spirit of the present disclosure. For example, some elements in one embodiment can be added to another embodiment within the ordinary range of creativity of those skilled in the art. Also, some elements in one embodiment can be replaced with corresponding elements from another embodiment.

For example, some or all of the voltage supplied to the electrostatic chuck 61 in the cleaning method may be supplied while plasma is being formed. Also, the supply of voltage to the electrostatic chuck 61 may be performed while plasma is not being formed.

The cleaning method can also be applied to a cleaning process other than the second cleaning process P3 or the first cleaning process P2.

The processing method can also be applied in a sequence other than one in which the plasma processing P1, the first cleaning process P2, and the second cleaning process P3 are repeated.

In addition, the cleaning method and the processing method may be performed using a plasma processing apparatus using a plasma source other than that of a capacitively coupled plasma processing apparatus 1, such as inductively coupled plasma or microwave plasma.

In one exemplary embodiment of the present disclosure, a technique can be provided that is able to reduce the charge on the electrostatic chuck surface.

The embodiments described above were provided for illustrative purposes only and are not intended to limit the scope of the present disclosure. Various modifications may be applied to each of these embodiments without departing from the scope and spirit of the present disclosure.

For example, some elements in one embodiment can be added to another embodiment. Also, some elements in one embodiment can be replaced with corresponding elements from another embodiment.

The invention claimed is:

1. A cleaning method in a plasma processing apparatus for plasma processing a substrate, the method comprising:

(a) forming a plasma in a chamber of the plasma processing apparatus while a substrate is not being held in place by an electrostatic chuck in the chamber;

(b) supplying voltage to the electrostatic chuck to reduce charge on a surface of the electrostatic chuck while plasma is being formed in (a); and (c) measuring charged state on the surface of the electrostatic chuck while plasma is being formed in (a), wherein the voltage to be supplied to the electrostatic chuck in (b) is determined on a basis of the charged state on the surface of the electrostatic chuck measured in (c).

2. The cleaning method according to claim 1, wherein (a) includes supplying power for forming plasma, wherein the supply of voltage to the electrostatic chuck in (b) begins after the supply of power for forming plasma has begun in (a), and wherein the supply of voltage to the electrostatic chuck in (b) stops before the supply of power for forming plasma has stopped in (a).

3. The cleaning method according to claim 1, wherein (a) includes supplying processing gas, the supply of voltage to the electrostatic chuck in (b) begins after the supply of processing gas has begun in (a), and the supply of voltage to the electrostatic chuck in (b) stops before the supply of processing gas has stopped in (a).

4. The cleaning method according to claim 1, wherein the voltage to be supplied to the electrostatic chuck in (b) is determined from measurement results for the charged state on the surface of the electrostatic chuck in (c) on the basis of a relationship between the charged state on the surface of the electrostatic chuck and the voltage to be supplied to the electrostatic chuck in the charged state on the surface of the electrostatic chuck.

5. The cleaning method according to claim 1, wherein plasma is formed in the chamber in (a) to clean the surface of the electrostatic chuck in the chamber.

6. The cleaning method according to claim 1, wherein plasma is formed in the chamber in (a) to clean an interior of the chamber.

7. The cleaning method according to claim 1, the method comprising:

(a1) forming a plasma in a chamber of the plasma processing apparatus while a substrate is not being held in place by an electrostatic chuck in the chamber to clean an interior of the chamber;

(b1) supplying voltage to the electrostatic chuck to reduce the charge on the surface of the electrostatic chuck while plasma is being formed in (a1);

(a2) forming a plasma in a chamber of the plasma processing apparatus while a substrate is not being held in place by the electrostatic chuck in the chamber to clean the surface of the electrostatic chuck in the chamber; and (b2) supplying voltage to the electrostatic chuck to reduce the charge on the surface of the electrostatic chuck while plasma is being formed in (a2).

8. The cleaning method according to claim 7, wherein the voltage supplied to the electrostatic chuck in (b1) and in (b2) is different.

9. A cleaning method in a plasma processing apparatus, the plasma processing apparatus comprising:

a chamber;

an electrostatic chuck for holding a substrate in place in the chamber;

a gas supply for supplying a processing gas in the chamber; and a plasma generator for forming a plasma from the processing gas, the method comprising:

(a) starting to supply the processing gas in the chamber while a substrate is not being held in place by the electrostatic chuck;

(b) starting to supply power for forming plasma to the plasma generator after (a);

(c) starting to supply voltage to the electrostatic chuck after (b); and (d) measuring charged state on the surface of the electrostatic chuck while plasma is being formed in (b), wherein the voltage to be supplied to the electrostatic chuck in (c) is determined on a basis of the charged state on the surface of the electrostatic chuck measured in (d).

10. The cleaning method according to claim 9, wherein (c) is performed while plasma is being formed in the chamber.

11. The cleaning method according to claim 9, further comprising:

(e) stopping the supply of voltage to the electrostatic chuck;

(f) stopping the supply of power for forming plasma after (e); and (g) stopping the supply of processing gas in the chamber after (f).

12. The cleaning method according to claim 11, wherein the processing gas is supplied continuously in time between starting the supply of processing gas in (a) and stopping the supply of processing gas in (g).

13. The cleaning method according to claim 11, wherein the power for forming plasma is supplied continuously in time between starting the supply of power for forming plasma in (b) and stopping the supply of power for forming plasma in (f).

* * * * *